United States Patent
Ashley et al.

(10) Patent No.: US 6,809,514 B2
(45) Date of Patent: Oct. 26, 2004

(54) MAGNETIC FIELD SENSOR INCLUDING CARRIER EXCLUDING FOR REDUCING AN INSTRINSIC CONTRIBUTION TO CARRIER CONCENTRATION IN THE ACTIVE REGION

(75) Inventors: Timothy Ashley, Malvern (GB); Charles T Elliott, Malvern (GB); Timothy J Phillips, Malvern (GB)

(73) Assignee: Qinetiq Limited, Farnborough (GB)

( * ) Notice: Subject to any disclaimer, the term of this patent is extended or adjusted under 35 U.S.C. 154(b) by 0 days.

(21) Appl. No.: 10/258,852

(22) PCT Filed: May 2, 2001

(86) PCT No.: PCT/GB01/01923

§ 371 (c)(1),
(2), (4) Date: Oct. 29, 2002

(87) PCT Pub. No.: WO01/88561

PCT Pub. Date: Nov. 22, 2001

(65) Prior Publication Data

US 2003/0094943 A1 May 22, 2003

(30) Foreign Application Priority Data

May 19, 2000 (GB) .............................................. 0012014

(51) Int. Cl.[7] .............................................. G01R 33/06
(52) U.S. Cl. ..................... 324/251; 324/252; 338/32 R; 338/32 H; 428/692
(58) Field of Search .......................... 338/32 H, 32 R; 324/207.21, 251, 252; 428/692; 360/112

(56) References Cited

U.S. PATENT DOCUMENTS

| | | | |
|---|---|---|---|
| 4,843,444 A | * | 6/1989 | Partin et al. ................. 257/424 |
| 4,900,687 A | | 2/1990 | Partin et al. |
| 4,926,226 A | * | 5/1990 | Heremans et al. .......... 257/424 |
| 4,929,993 A | | 5/1990 | Popovic |
| 5,153,557 A | | 10/1992 | Partin et al. |
| 5,173,758 A | | 12/1992 | Heremans |
| 5,184,106 A | * | 2/1993 | Partin et al. ............... 338/32 R |
| 5,314,547 A | | 5/1994 | Heremans et al. |
| 5,491,461 A | * | 2/1996 | Partin et al. ............... 338/32 R |
| 5,883,564 A | * | 3/1999 | Partin ........................ 338/32 R |

FOREIGN PATENT DOCUMENTS

| | | |
|---|---|---|
| EP | 0 040 640 A1 | 12/1981 |
| EP | 0 375 107 A | 6/1990 |
| EP | 0 548 375 A | 6/1993 |
| EP | 0 678 925 A | 10/1995 |
| EP | 0 829 732 A | 3/1998 |

* cited by examiner

*Primary Examiner*—Jay Patidar
(74) *Attorney, Agent, or Firm*—Nixon & Vanderhye P.C.

(57) ABSTRACT

The invention provides a Hall effect magnetic field sensor (10, 50) including carrier excluding or extracting means (36, 66) for reducing an intrinsic contribution to carrier concentration in the active region (14e, 53c) to provide for the sensor to be operative in an extrinsic saturated regime. This provides an advantage that magnetic field measurement sensitivity of the sensor (10, 50) can be made substantially insensitive to sensor temperature thereby improving measurement accuracy.

27 Claims, 15 Drawing Sheets

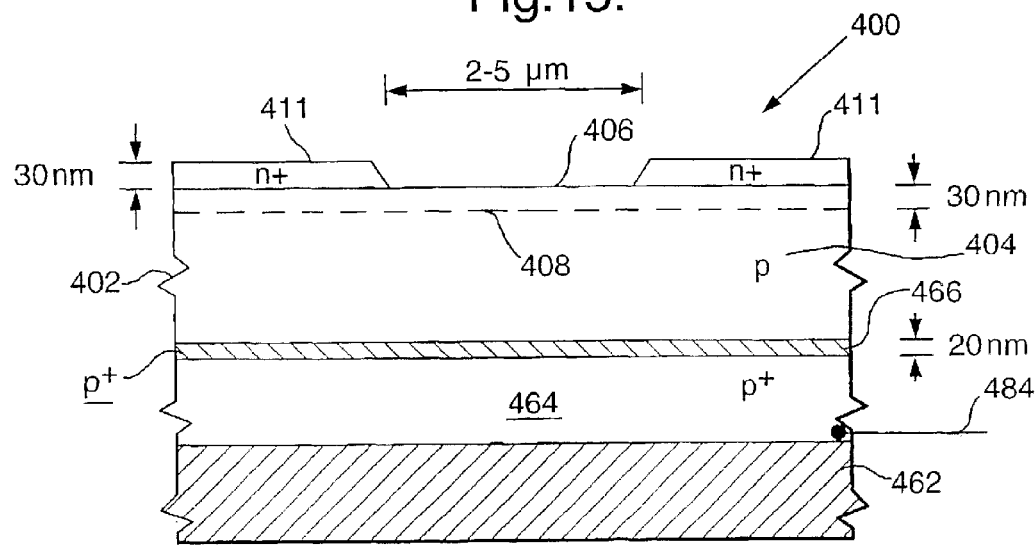
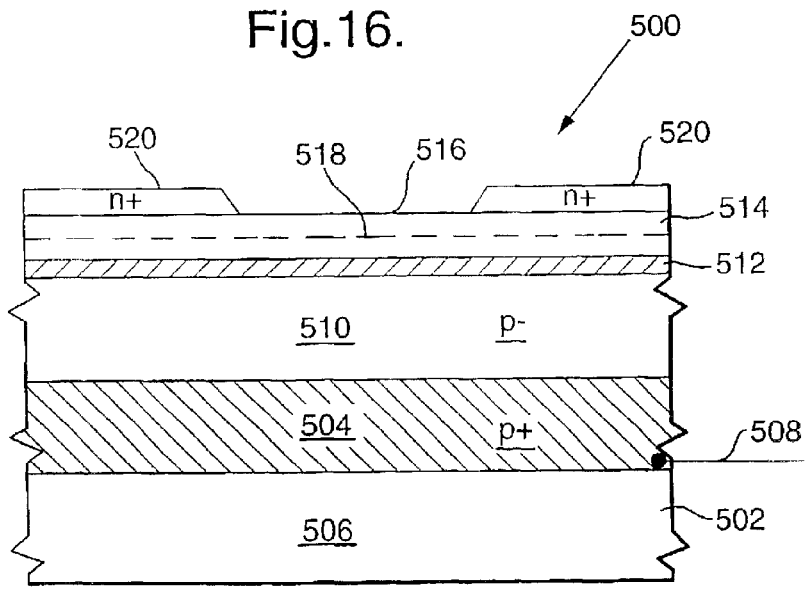

MAGNETIC FIELD SENSOR INCLUDING CARRIER EXCLUDING FOR REDUCING AN INSTRINSIC CONTRIBUTION TO CARRIER CONCENTRATION IN THE ACTIVE REGION

This application is the US national phase of international application PCT/GB01/01923 filed May 2, 2001, which designated the US.

This invention relates to a magnetic field sensor of semiconductor material.

Before considering the prior art, semiconductor properties will be discussed. Semiconductor magnetic field sensors operate using electrical transport effects, and broadly speaking, there are three important conduction regimes: unsaturated extrinsic, saturated extrinsic and intrinsic, and these occur at low, moderate and high temperature respectively. In the unsaturated extrinsic regime, there is insufficient thermal energy to ionise all impurities and the carrier concentration is temperature dependent because increasing the temperature ionises more impurities. Carriers are activated from dopant impurities of a single species, ie donors or acceptors. Conduction is due substantially to one kind of carrier in one band, ie electrons in the conduction band or holes in the valence band but not both. The saturated extrinsic regime is similar, but occurs at higher temperatures at which virtually all impurities have become ionised but insufficient thermal energy is available to ionise significant numbers of valence band states to create electron-hole pairs: here the carrier concentration is largely independent of temperature.

In the intrinsic regime, conduction has a substantial contribution from thermal ionisation of valence band states producing both types of carrier, ie electron-hole pairs, in addition to carriers of one type activated from impurities. Conduction is due to both kinds of carrier in both bands, ie electrons in the conduction band and holes in the valence band. Conductivity varies with temperature in this regime because the electron-hole pair concentration is temperature dependent. There is an intervening transition region between the extrinsic and intrinsic regimes where conduction is partially extrinsic and partially intrinsic giving rise to more of one type of charge carrier than the other, ie majority carriers and minority carriers: it is at or near ambient temperature in Ge depending on doping. The onset temperature of intrinsic conduction depends on band gap and dopant concentration; it can occur below ambient temperature, as low as 150K in narrow gap semiconductors with low doping.

Materials such as Si and GaAs with a saturated extrinsic regime at room temperature are preferred for magnetic field sensor applications despite their inferior mobility properties: this is because of the need for Hall effect or resistance to be largely independent of temperature. By analogy with Ge which if sufficiently purified is intrinsic at ambient temperature, weakly doped Si is sometimes referred to wrongly as intrinsic, such as in PIN diodes where the high resistivity I ("intrinsic") region is in fact extrinsic at ambient temperature. The purest Si currently available is more than an order of magnitude too impure to be intrinsic at ambient temperature.

Magnetic field sensors involving semiconductor materials have been known for many years. They include:
(a) magneto-resistance sensors which change in electrical resistance in response to applied magnetic field, and
(b) Hall effect sensors which respond to a magnetic field by developing a voltage proportional to sensor current and field strength.

The electrical resistance $R_M$ of an extrinsic magneto-resistance sensor in a magnetic field B is given by:

$$R_M = R_0(1+\mu^2 B^2) \quad (1)$$

where $\mu$ is charge carrier mobility and $R_0$ is sensor resistance in the absence of a magnetic field. The magneto-resistance contribution to Equation (1) is $\mu^2 B^2 R_0$ which varies as the square of both mobility and magnetic field.

A conventional Hall effect sensor arrangement consists of a rectangular block of semiconductor material carrying a longitudinal current in a transverse magnetic field: this produces a Hall voltage $V_H$ orthogonal both to field and current: for an extrinsic semiconductor arranged in this way, $V_H$ is given by:

$$V_H = E_y t_y = \frac{1}{ne} j_x B_z t_y \quad (2)$$

where
$E_y$=Hall effect electric field;
$t_y$=semiconductor thickness dimension across which $V_H$ is measured;
n=charge carrier concentration;
e=charge on each charge carrier (negative for electrons, positive for holes);
$j_x$=current density in the semiconductor per unit cross-sectional area;
$B_z$=magnetic field; and
indexes x, y, z indicate x y and z co-ordinate axes and directions of parameters to which they are suffixed.

For an extrinsic regime with one type of charge carrier, the Hall coefficient $R_H$ is defined as $$R_H = \frac{E_H}{j_x B_z} = \frac{1}{ne} \quad (3)$$

The situation is more complicated than Equation (3) indicates if the semiconductor is in an intrinsic regime with two types of charge carrier.

The conductivity σ of a material is given by $$\sigma = ne\mu_c \quad (4)$$

where $\mu_c$ is the conductivity mobility.

A carrier mobility value $\mu_H$ referred to as the Hall mobility is obtainable by multiplying Equations (3) and (4) together, ie:

$$\mu_H = \sigma R_H \quad (5)$$

If conduction is extrinsic, the Hall mobility differs from the conductivity mobility by a numerical factor whose magnitude depends on the carrier scattering mechanism. However, Hall and conductivity mobilities follow the same general principles and will hereinafter be treated as equal and referred to as $\mu$. If conduction is intrinsic the expression for the Hall coefficient is more complex and is magnetic field dependent.

A large Hall voltage is desirable for ease of measurement; it can be achieved by using a high current density, which requires low resistivity to limit power dissipation and hence high carrier mobility. It is also desirable for magneto-resistance sensors to have high carrier mobility to reduce resistance and hence power consumption and to increase the sensitivity of magneto-resistance to magnetic field, which as has been said varies as the square of mobility from Equation (1). Narrow band gap semiconductors such as InSb or InAs best satisfy this mobility criterion. InSb has an electron mobility $\mu_e$ of 8 $m^2V^{-1}s^{-1}$, nearly ten times that of GaAs, which is 0.85 $m^2V^{-1}s^{-1}$ and is in turn better than that of Si.

Despite their splendid mobility properties, narrow band gap semiconductors are not generally used for Hall effect or magneto-resistance sensors because they are intrinsic at ambient temperature. This results in low Hall coefficient and Hall voltage, and in Hall voltage and sensor resistance varying with temperature; it conflicts with an important requirement of a magnetic field sensor, namely that its response to magnetic field should be relatively insensitive to temperature change. Another consequence of the intrinsic regime is that Hall effect is non-linear with magnetic field (magneto-resistance varies as the square of magnetic field irrespective of regime). These problems have placed restrictions on use of narrow band gap semiconductors in magnetic field sensors operating at room temperature (290K) or above: in particular, they need to be heavily doped to reduce the temperature dependence of the carrier concentration (i.e. to make them extrinsic). This tends to defeat the object of using them, because it reduces their carrier mobility considerably counteracting their advantage.

Conventional magnetic field sensors are operated in the saturated extrinsic regime, where the carrier concentration is largely constant and does not produce unwanted changes in resistance and Hall effect. Temperature dependence of resistance and Hall effect arises however from mobility reduction with rise in temperature due to increased phonon scattering and onset of electron-hole scattering.

Prior art magnetic sensors based on silicon technology tend to be physically robust and are widely used in the motor industry in harsh environments: They are used for example in brushless compact disc (CD) drive motors where low noise is paramount. However, they suffer from the general problem of temperature dependent sensitivity, and moreover their sensitivity is inadequate for some applications.

It is an object of this invention to provide an alternative form of magnetic field sensor.

The present invention provides a magnetic field sensor incorporating a semiconducting sensor element with an active region in which a signal responsive to magnetic field is developed in operation, characterised in that the sensor element:

(a) is in an at least partially intrinsic conduction regime when unbiased and at a normal operating temperature;

(b) includes a junction which is biasable to reduce intrinsic conduction in the active region and confine charge carriers predominantly to one type only corresponding to an extrinsic saturated regime regime, and (c) includes means for detecting a signal developed in the active region (14e, 53e) in response to applied magnetic field.

Biasable junctions of the kind indicated above are known per se in photodiodes from U.S. Pat. No. 5,016,073.

The invention provides the advantage that it enables magnetic field sensors to be made from a high mobility material hitherto considered unsuitable due to intrinsic conduction. Furthermore, in the case of a Hall effect sensor, it is possible to obtain improved linearity of the Hall effect as a function of magnetic field: this is a consequence of reducing intrinsic conduction, ie removing electrons and holes in equal numbers and changing conduction in both conduction and valence bands to conduction substantially in one band by one carrier only. In practice, intrinsic conduction is not completely eliminated but it is reduced to negligible proportions.

The biasable junction may be an excluding contact for exclusion of minority carriers from the active region, and may be a homojunction between indium antimonide materials of different doping concentration or a heterojunction between indium antimonide and a material having a wider band gap than indium antimonide.

The sensor may be a cruciform Hall effect sensor with a central region from which four limbs extend, at least one limb being connected to an excluding contact for depleting the active region's minority carrier concentration when biased, a first pair of limbs being connectable to a current supply and a second pair of limbs being connectable to Hall voltage measuring apparatus. Each limb may be connected to a respective excluding contact, and each limb of the second pair may have a tapering portion adjacent the central region.

The biasable junction may be an extracting junction for extraction of minority carriers from the active region. It may be a junction between two sensor regions of materials having different majority carrier type and different band gap, and be sufficiently thick to prevent electron tunnelling and sufficiently thin to avoid relaxing strain in materials associated with it. It may be heterojunction of n-type InSb and $In_{1-x}Al_xSb$ where x is in the range 0.10 to 0.5, or 0.15 to 0.2, or substantially 0.15.

The sensor may be cruciform with four limbs and a central region and have four successively disposed layers of which two adjacent layers are of one majority carrier type and two other adjacent layers are of the other majority carrier type, the junction may be a heterojunction between an active region layer and another layer of different band gap and majority carrier type, a first pair of limbs being connectable to a current supply, a second pair of limbs (14b, 14d) being connectable to Hall voltage measuring apparatus, and the junction being an extracting junction reverse-biasable by means of a sensor substrate connection. The four successively disposed layers may be an $n^+npp^+$ structure and the second pair of limbs may have a tapering portion adjacent the central region. The second pair of limbs may have a contact region adjoining the central region which less than 10% of the limb width of each limb of the first pair of limbs.

The junction may be arranged for extraction current flow in a direction substantially orthogonal to charge carrier deflection by a magnetic field in normal operation.

The active region in the sensor may be p-type and the biasable junction extracting. It may be provided with a dominant source of charge carriers in the form of a δ-doping layer. It may incorporate a quantum well providing a conduction path therein. The sensor itself may be an $n^+$-$\underline{p}^-$-quantum well-$\underline{p}^-$-$p^+$ diode structure.

The sensor may alternatively be an $n^+$-p-$\underline{p}^+$-$p^+$ diode structure.

In another aspect, the invention provides a method of detecting a magnetic field, characterised in that it includes the steps of:

a) providing a magnetic field sensor incorporating a semiconducting sensor element with an active region in which a signal responsive to magnetic field is developed during operation, the sensor element being in an at least partially intrinsic conduction regime at a normal operating temperature when unbiased, and including a junction which is biasable to reduce an intrinsic contribution to conduction in the active region and confine charge carriers predominantly to one type only corresponding to an extrinsic saturated regime;

b) biasing the sensor active region and the junction to provide for charge carrier flow in the active region and sensor operation to correspond to an extrinsic saturated regime and applying a magnetic field to the active region; and c) detecting a signal developed by the active region at least partially in response to the magnetic field.

The step of biasing the sensor active region may be carried out at constant voltage, the step of detecting a signal involving detecting a voltage signal.

The sensor may be a Hall effect sensor, the step of biasing the sensor active region involving applying a constant current thereto and the step of detecting a signal involving detecting a current signal.

In order that the invention might be more fully understood, embodiments thereof will now be described, by way of example only, with reference to accompanying drawings, in which.

Figure 1:
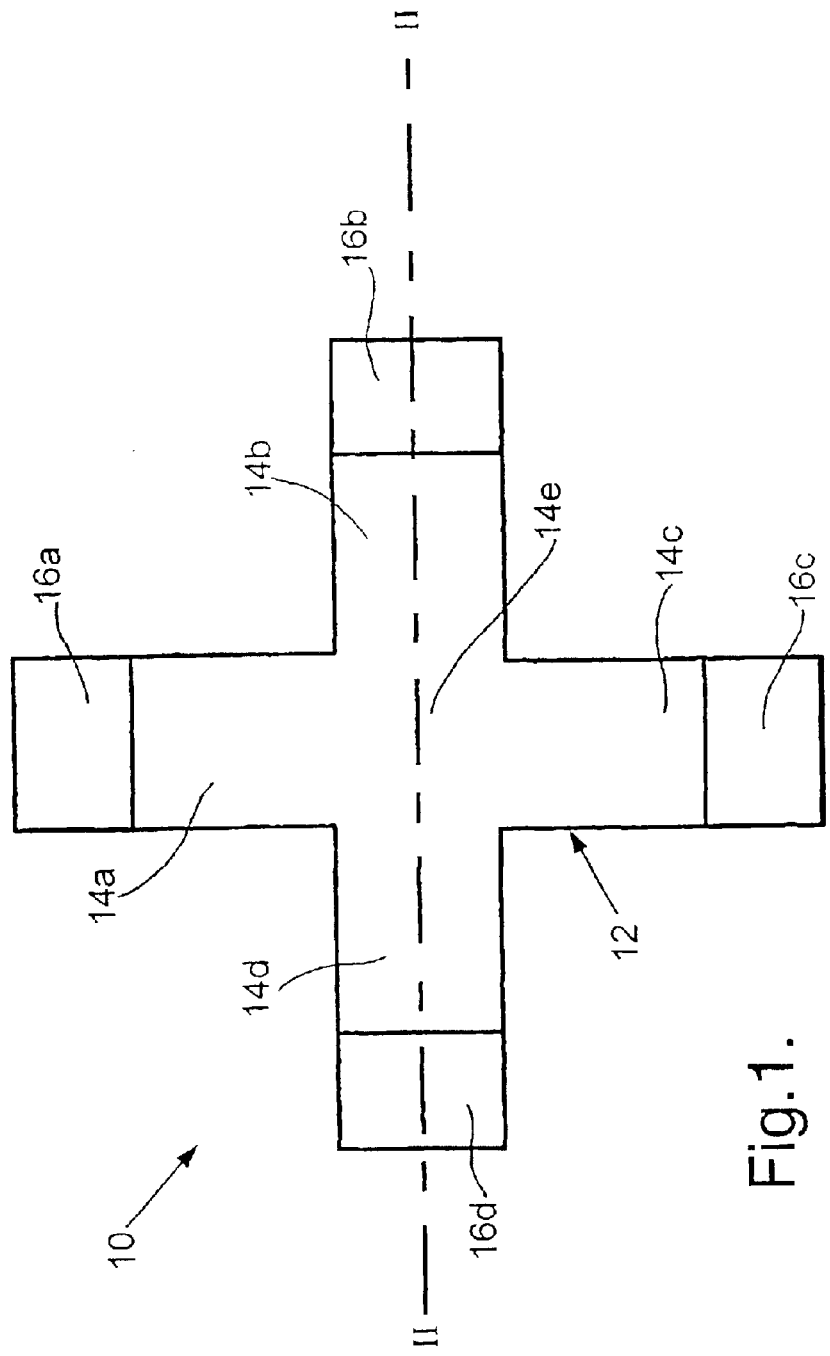
FIG. 1 is a schematic plan view of a magnetic field sensor of the invention in the form of a Hall effect device.
Figure 5:
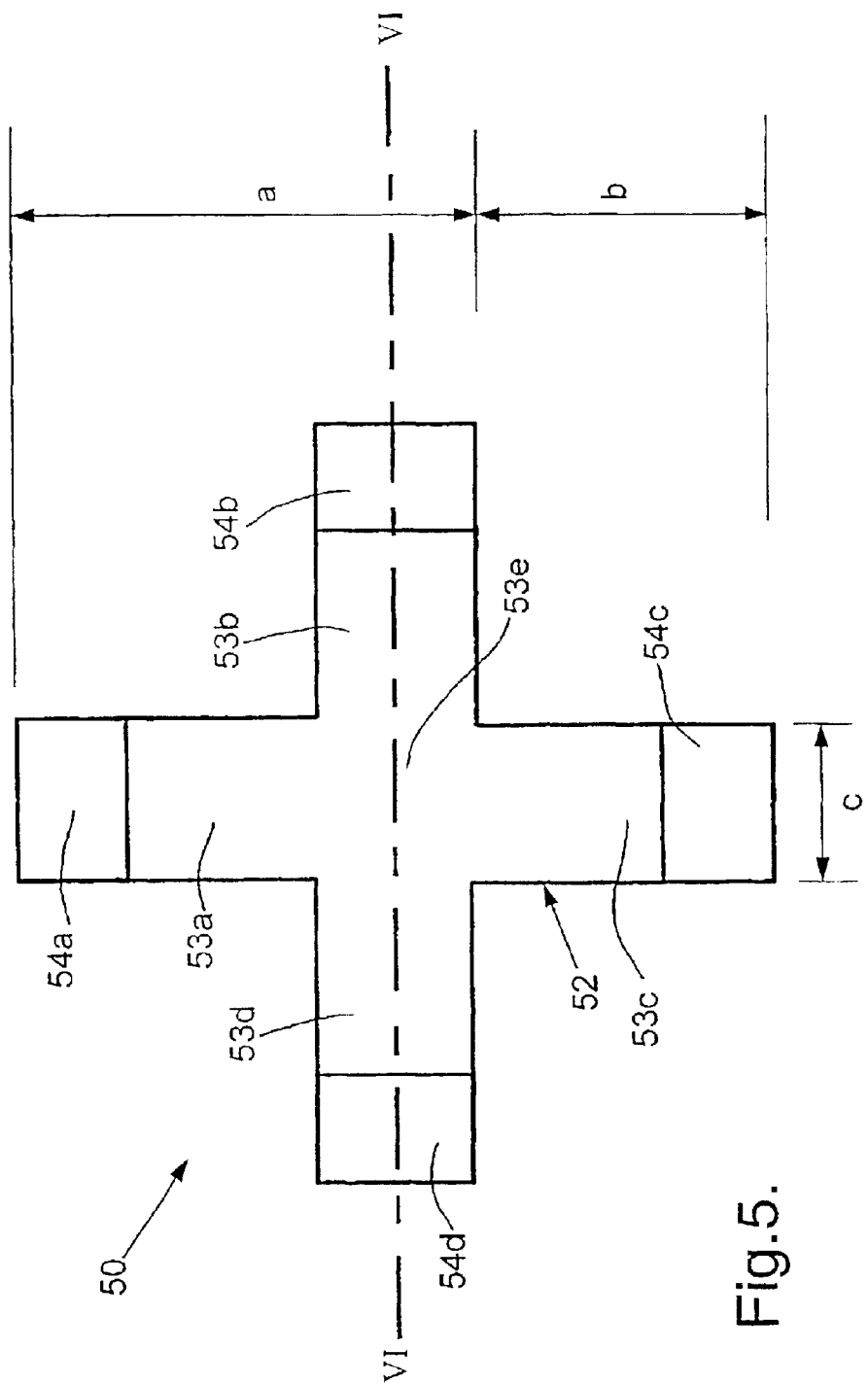
FIG. 5 illustrates a further sensor of the invention.
Figure 9:
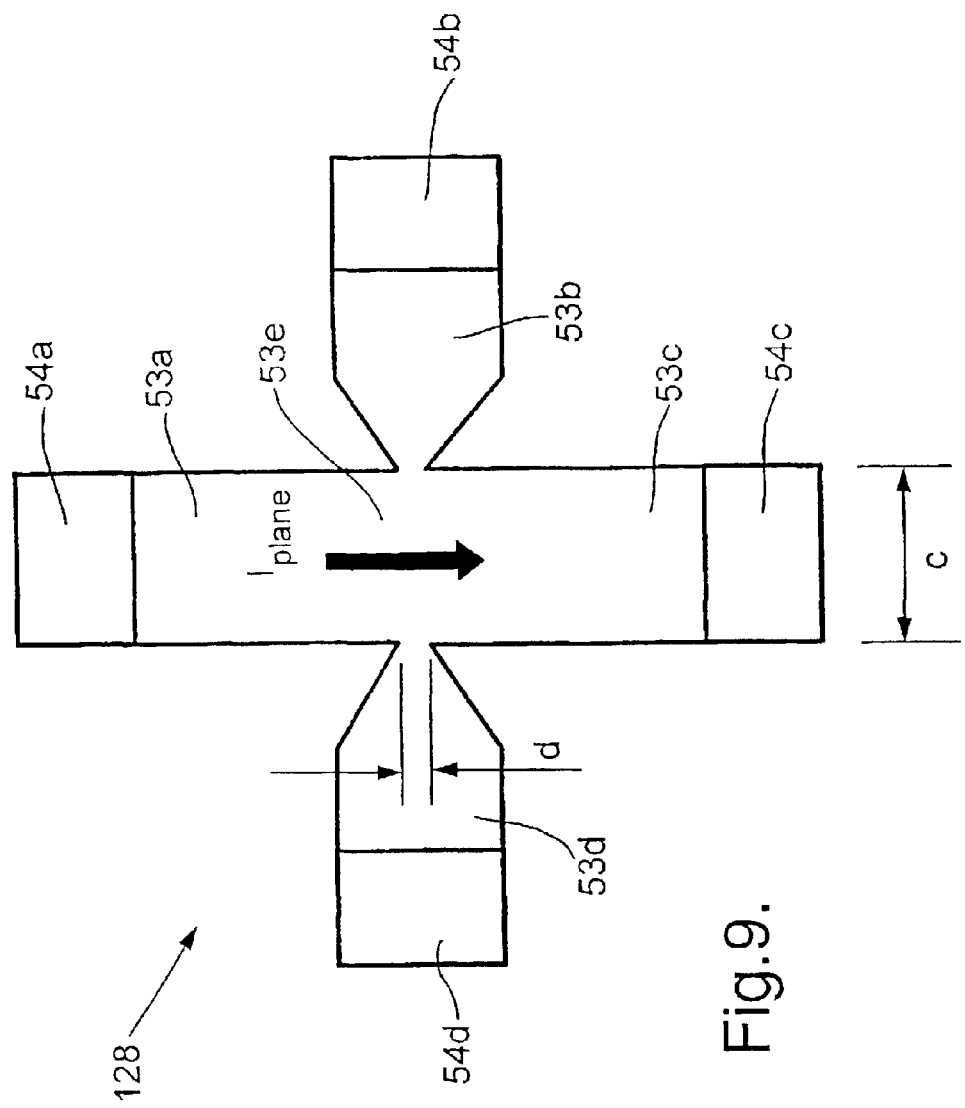
Figure 10:
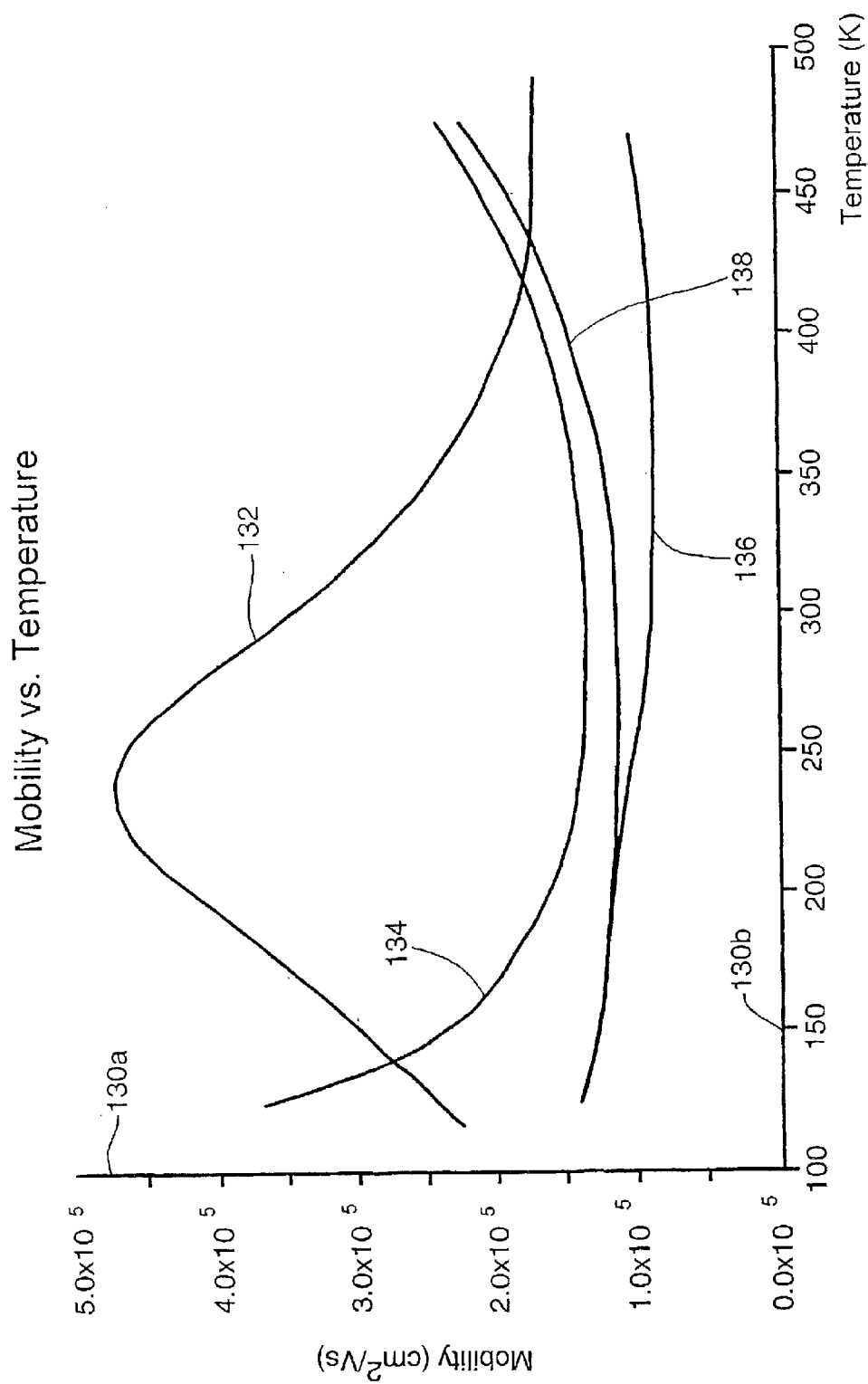
Figure 11:
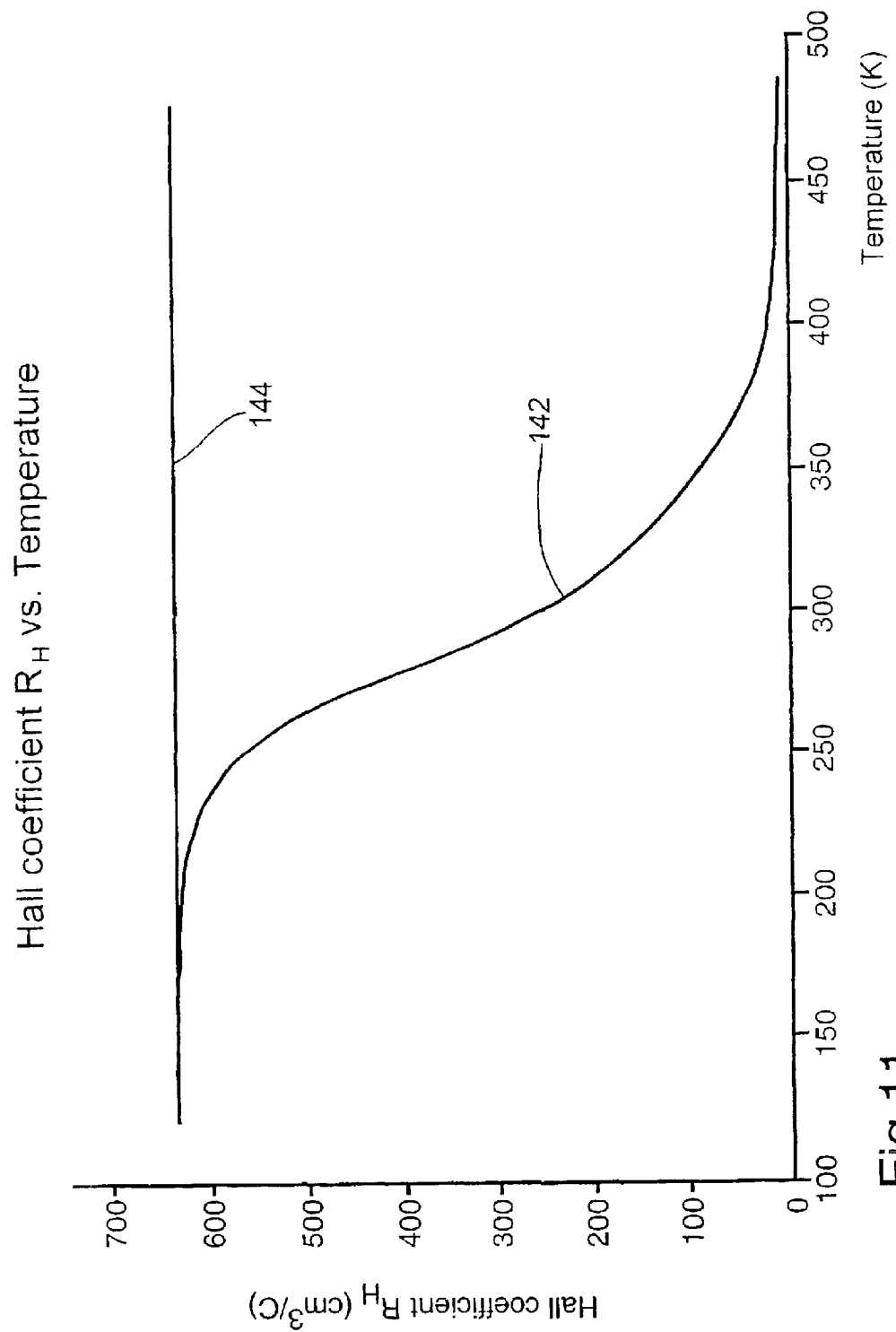
Figure 12:
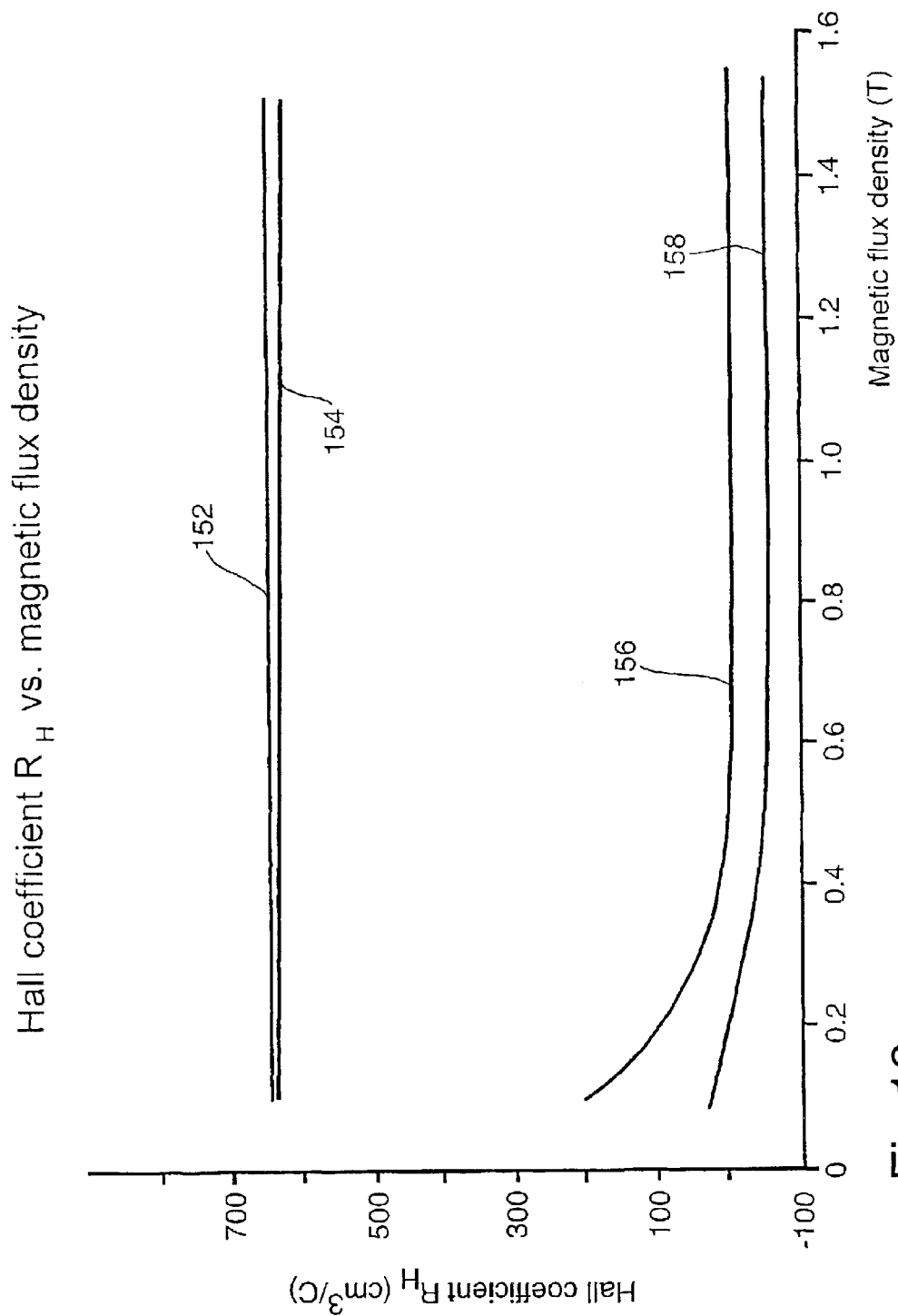
Figure 13:
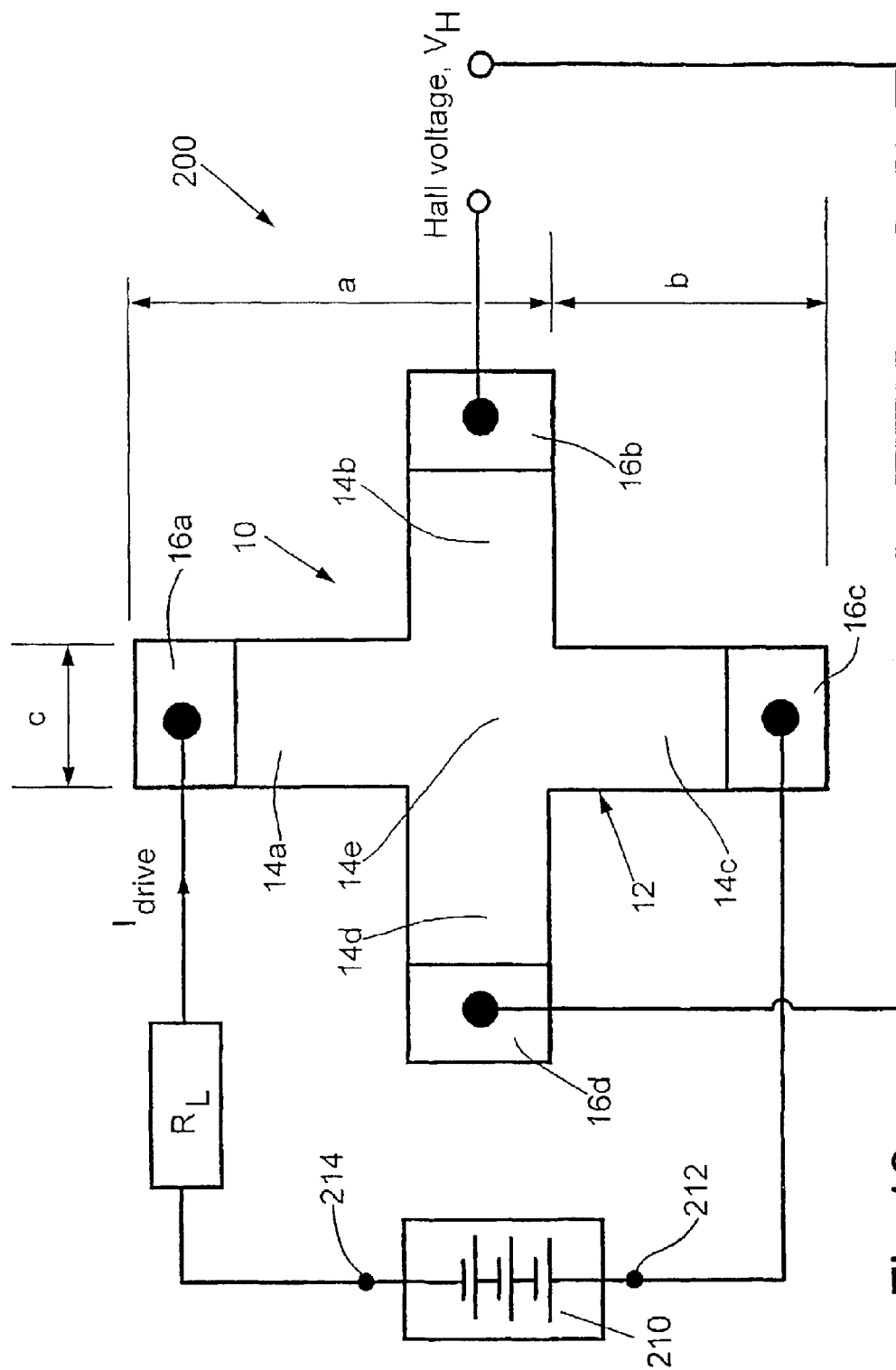
Figure 14:
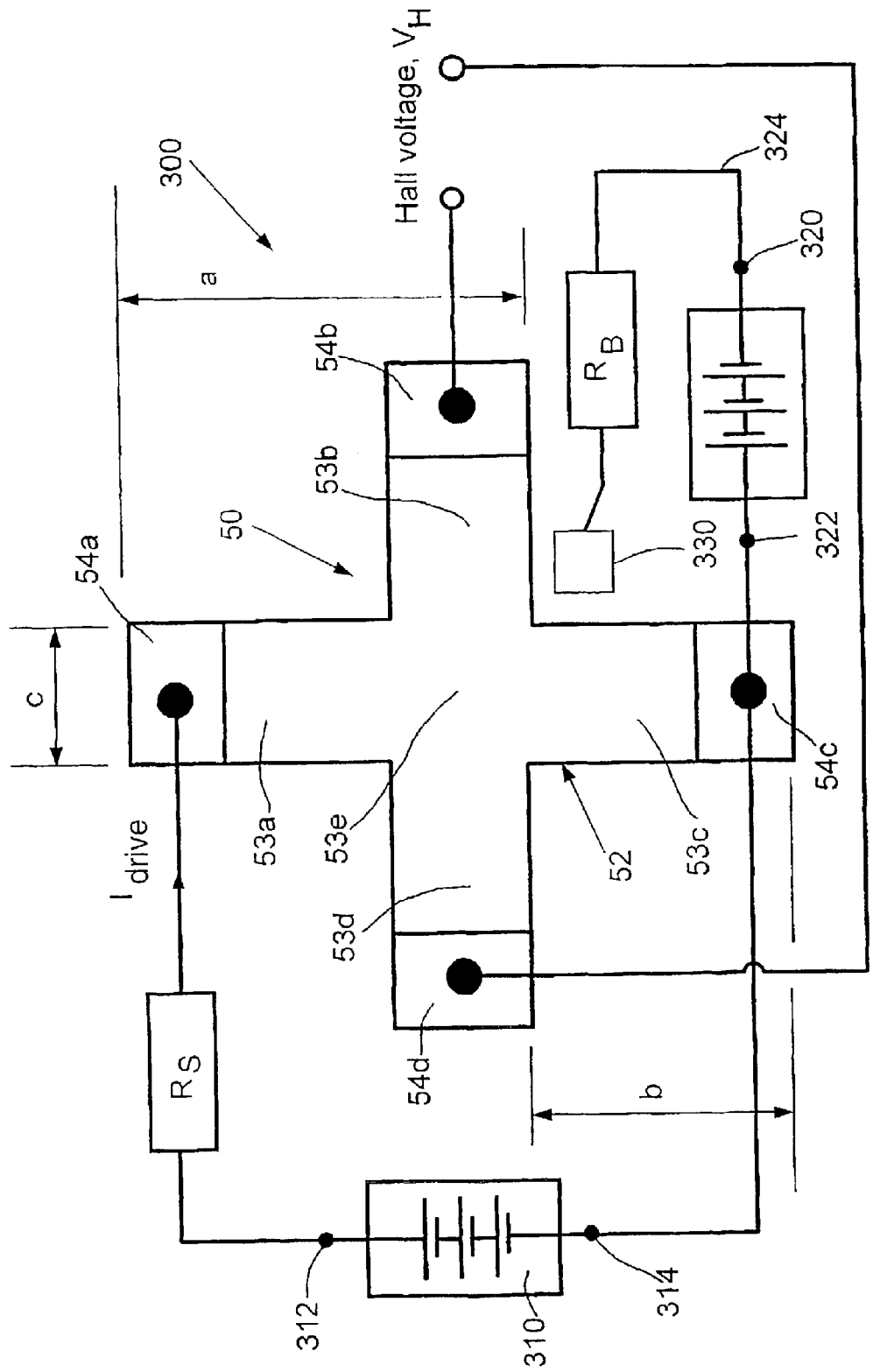

FIG. 9 gives another geometry for the sensor shown in FIG. 5;

FIG. 10 illustrates contributions to electron mobility in n-type InSb under various conditions of sensor operation;

FIG. 11 illustrates the effect of temperature variation on the Hall coefficient $R_H$ for equilibrium and extracted InSb;

FIG. 12 is an illustration of the variation of Hall coefficient $R_H$ with magnetic flux density for both equilibrium and extracted InSb;

FIG. 13 is a circuit for the sensor of FIG. 1;

FIG. 14 is a circuit for the sensor of FIG. 5.

Figure 2:
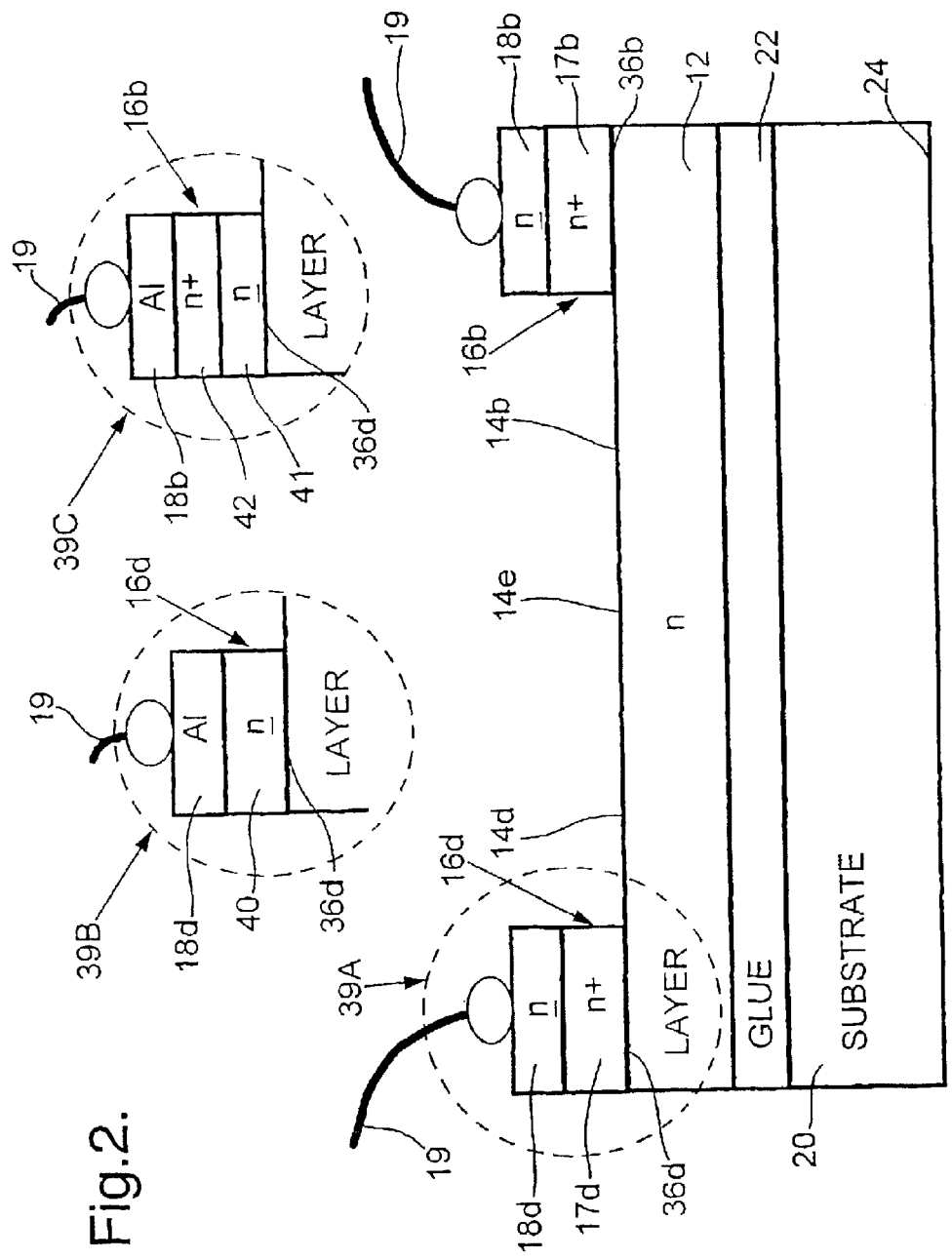
FIG. 2 is sectional view on lines II—II in FIG. 1.

FIG. 15 is a sectional view of a magnetic field sensor of the invention in the form of a magneto-resistive device; and FIG. 16 is a sectional view of a magneto-resistive sensor of the invention incorporating a quantum well;

Referring to FIGS. 1 and 2, there is shown a Hall effect magnetic field sensor 10 of the invention in plan and section respectively. It incorporates a cruciform layer 12 of n-type indium antimonide (InSb) with four limbs 14a to 14d (collectively 14) extending from a square central region 14e, limbs 14a and 14c being orthogonal to limbs 14b and 14d. Distal end lengths of the limbs 14 are covered by regions 16a to 16d (collectively 16) each consisting of a respective $n^+$-type InSb layer 17a to 17d (collectively 17) surmounted by aluminium (Al) electrodes 18a to 18d (collectively 18) respectively. The superscript "+" in $n^+$ denotes much higher doping concentration than that in the layer 12.

The sensor 10 has an insulating substrate 20 of sapphire, high resistivity silicon (>50 ohms/square) or insulating GaAs. As illustrated, the InSb layer 12 is attached to the substrate 20 by glue 22, but may alternatively be grown directly on a substrate such as semi-insulating GaAs. Each of the four electrodes 18 makes an ohmic contact to its respective $n^+$-type InSb layer 17 and is bonded to a respective connection wire 19.

Figure 3:
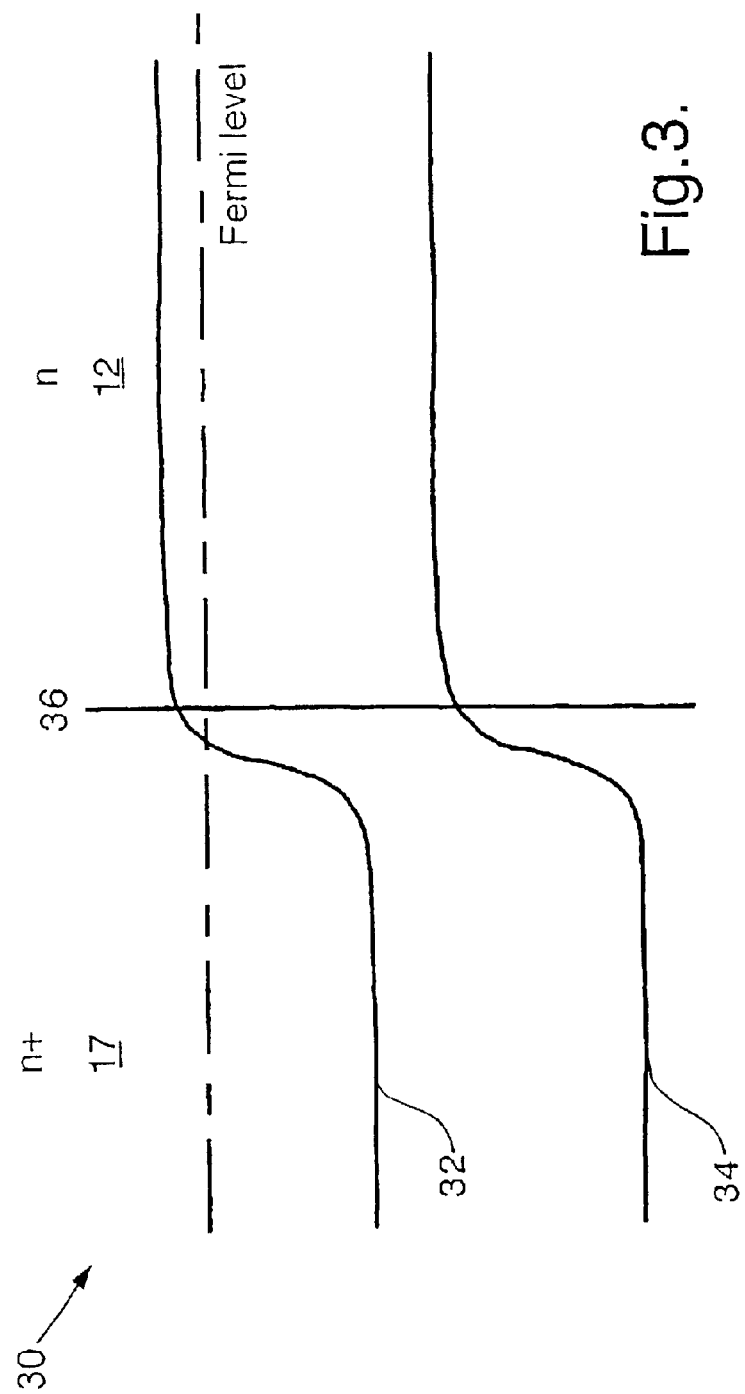
FIG. 3 shows the energy band structure of the sensor of FIGS. 1 and 2.

FIG. 3 is an energy band structure diagram 30 for the n and $n^+$ type InSb layers 12 and 17. It shows conduction and valence bands 32 and 34 for an unbiased $n^+n$ junction 36 between the layers 17 and 12 having parts 36b and 36d in FIG. 2.

The sensor 10 operates as follows. It is a minority carrier exclusion device in which each $n^+$-type layer 17 forms an $n^+n$ homojunction 36 with the underlying n-type layer 12. As previously indicated, carrier exclusion is known per se in relation to photodiodes from U.S. Pat. No. 5,016,073 to Elliott and Ashley. A bias voltage is applied across contacts 18a and 18c on mutually opposite limbs 14a and 14c, contact 18a being positive relative to contact 18c. Contacts 18b and 18d on mutually opposite limbs 14b and 14d are voltage probes for measuring Hall voltage. Because the $n^+$-type layer 17a is heavily doped it has a negligible minority carrier (hole) concentration. It is therefore capable of accepting majority carriers (electrons) from the layer 12 but largely incapable of returning to it minority carriers (holes) in view of its dearth of the latter. The $n^+n$ homojunction 17a/12 or 36 is therefore an excluding contact, that is electrons (majority carriers) flow freely from layer 12 to layer 17a but only a much smaller hole (minority carrier) current flows in the reverse direction from layer 17a to layer 12.

Moreover, holes are removed from the layer 12 at the opposite $n^+n$ homojunction between layers 17c and 12. In consequence, application of a bias voltage across contacts 18a and 18c results in the minority carrier concentration in the layer 12 becoming depleted because holes are removed from it but not fully replenished. The majority carrier concentration in this layer must fall by the same amount as the minority carrier concentration from charge neutrality considerations; electrons and holes are therefore reduced in equal numbers, which reduces the intrinsic contribution to conduction in the layer 12 (a reduction in the extrinsic contribution would affect the majority carrier type only). The excluded region, ie the region which is depleted of charge carriers in this way, extends through the layer 12 in limbs 14b and 14d between $n^+$-type layers 17a and 17c.

Chromium-gold (Cr—Au) electrodes may be employed instead of Al electrodes 18 by depositing a seed layer of Cr on the $n^+$-type layers 17 and then a thicker Au layer thereon.

Figure 4:
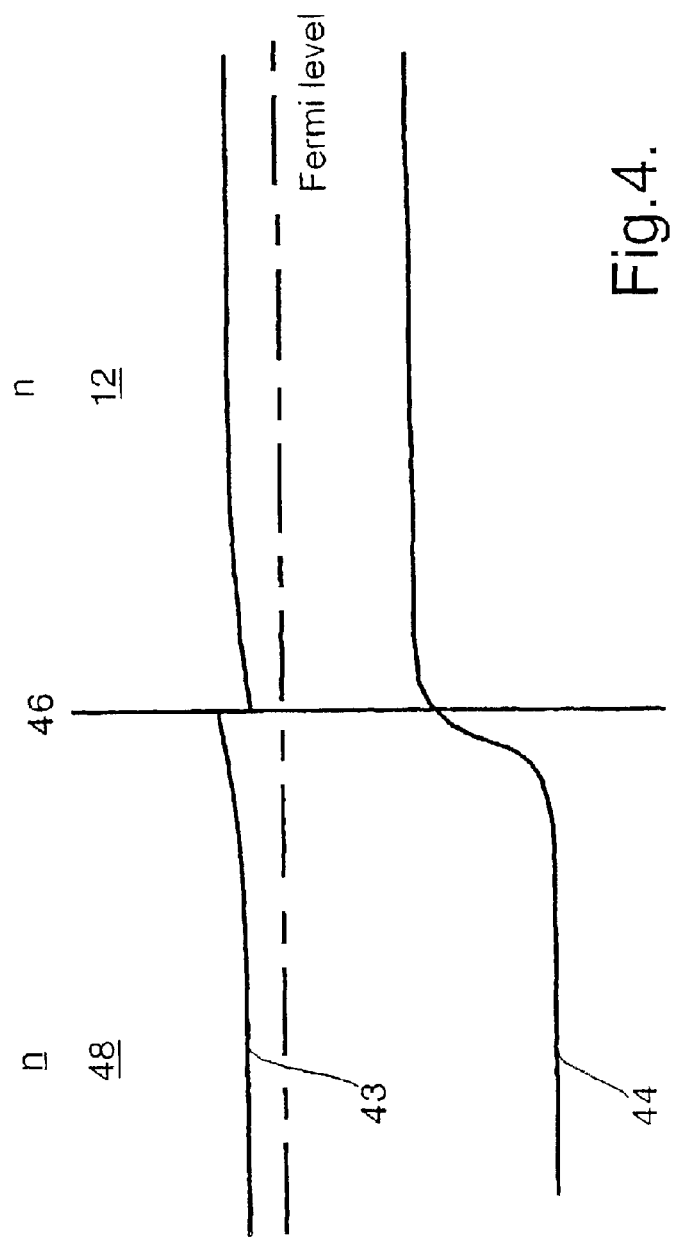
FIG. 4 shows the energy band structure of another sensor of the invention.

As indicated at 39A to 39C, in which parts previously described are like-referenced, each $n^+$-type InSb layer 17 may be replaced by a layer 40 of n-type material, or alternatively by two layers, an n layer 41 and an $n^+$ layer 42; here underlining in n (and later in p also) indicates a wider band gap material than a non-underlined equivalent, ie n. FIG. 4 is a band structure diagram showing the consequences of replacement of layer 17 by a layer 40 of n-type material of $In_{1-x}Al_xSb$ with x=0.15. Conduction and valence bands 43 and 44 are shown for an unbiased nn heterojunction 46 formed between the n-type layer 40 and the n-type InSb layer 12.

An n layer 40 has a low minority carrier (hole) concentration, because its wide band gap results in fewer electron-hole pairs being thermally excited than in a narrower band gap material. A bias voltage applied across contacts 18a and 18c removes holes from the n-type layer 12 which cannot be replaced from the n-type layer 40 because of its lack in this regard. Similar remarks apply to the layers 41 and 42.

Figure 6:
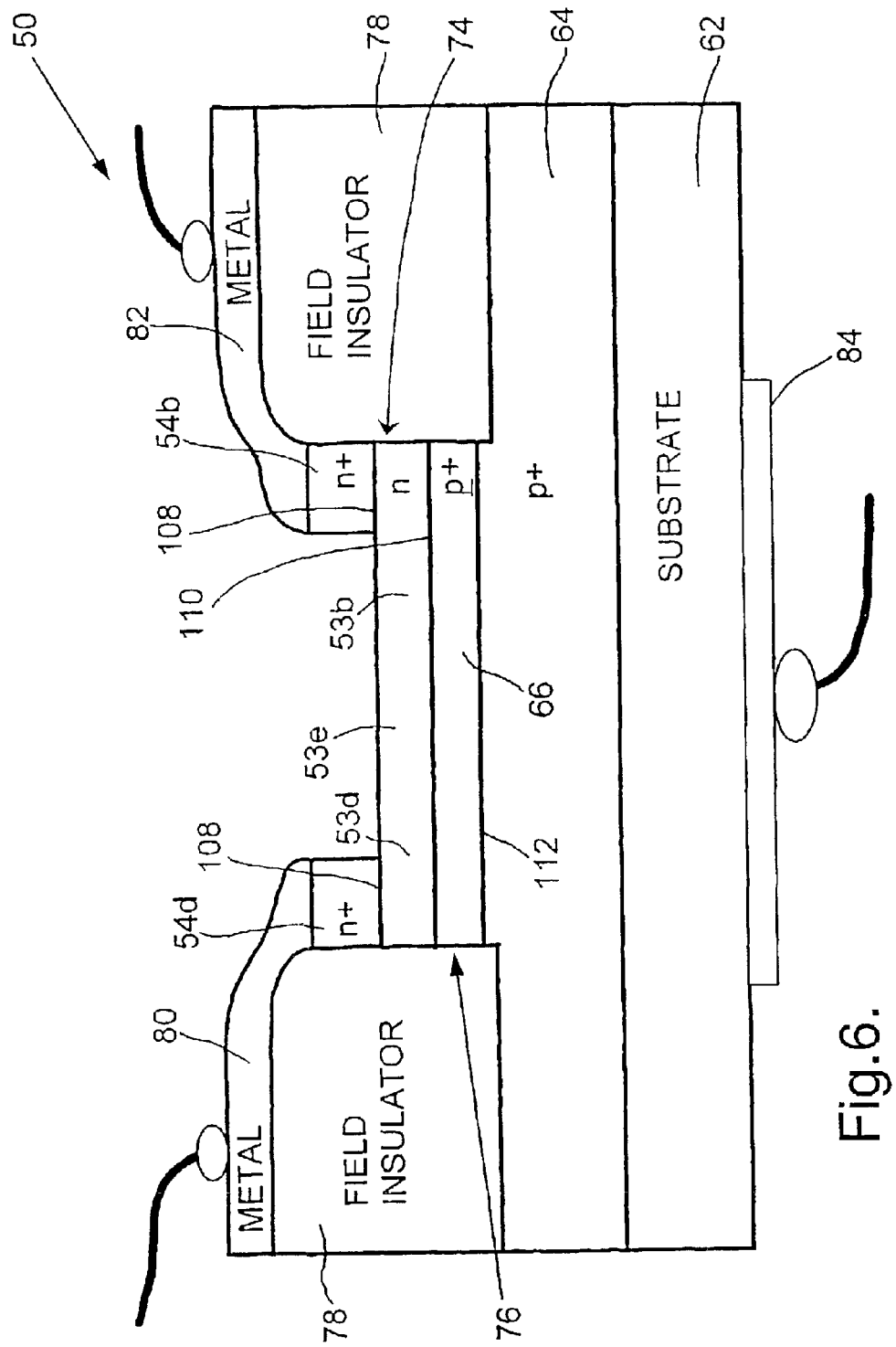
FIG. 6 is section on lines VI—VI in FIG. 5.

Referring now to FIG. 5, there is shown another Hall effect sensor 50 of the invention. It incorporates a cruciform structure 52 of n-type indium antimonide with four limbs 53a to 53d extending from a square central region 53e (collectively 53), limbs 53a and 53c being orthogonal to limbs 53b and 53d. Distal end lengths of the limbs 53 are covered by respective $n^+$-type InSb layers 54a to 54d (collectively 54) surmounted by aluminium electrodes (not shown). Dimensions of the limbs 53 and central region 53e are indicated by parameters a, b and c, where:

a=length of limb 53+side of square 53e
b=length of limb 53
c=a−b=width of limb 53=side of square 53e FIG. 6 is a section on line VI—VI in FIG. 5 perpendicular to the plane of the latter and showing the sensor 50 layer structure. It is not drawn to scale. The sensor 50 comprises a 2 μm thick layer 64 of p$^+$-type InSb upon a substrate 62 of InSb or GaAs. The layer 64 is surmounted by the cruciform structure 52 which comprises a 20 nm thick layer 66 of p̲$^+$-type In$_{1-x}$Al$_x$Sb with x in the range 0.1 to 0.5, preferably 0.1 to 0.2, eg 0.15. The layer 66 is covered by a 0.5 μm thick layer 53 of n-type InSb from which the limbs and centre 53 are constituted. Electrode layers 54b and 54d on end lengths of respective limbs 53 are n$^+$-type TnSb 0.3 μm thick; The n$^+$-type layers 54, the n-type layer 53 and p̲$^+$-type layer 66 each have two end faces lying in respective planes 74 and 76 and corresponding to end faces of limbs 53. The end faces 74 and 76 adjoin field insulators 78 fabricated on the p$^+$-type InSb layer 64. Alternatively, a layer of polyamide may be used instead of field insulator. Al contact layers 80 and 82 are formed on each n$^+$-type InSb region 54 and its adjacent field insulator 78. The substrate 62 has a fifth contact 84 is ohmic and of aluminium.

Figure 7:
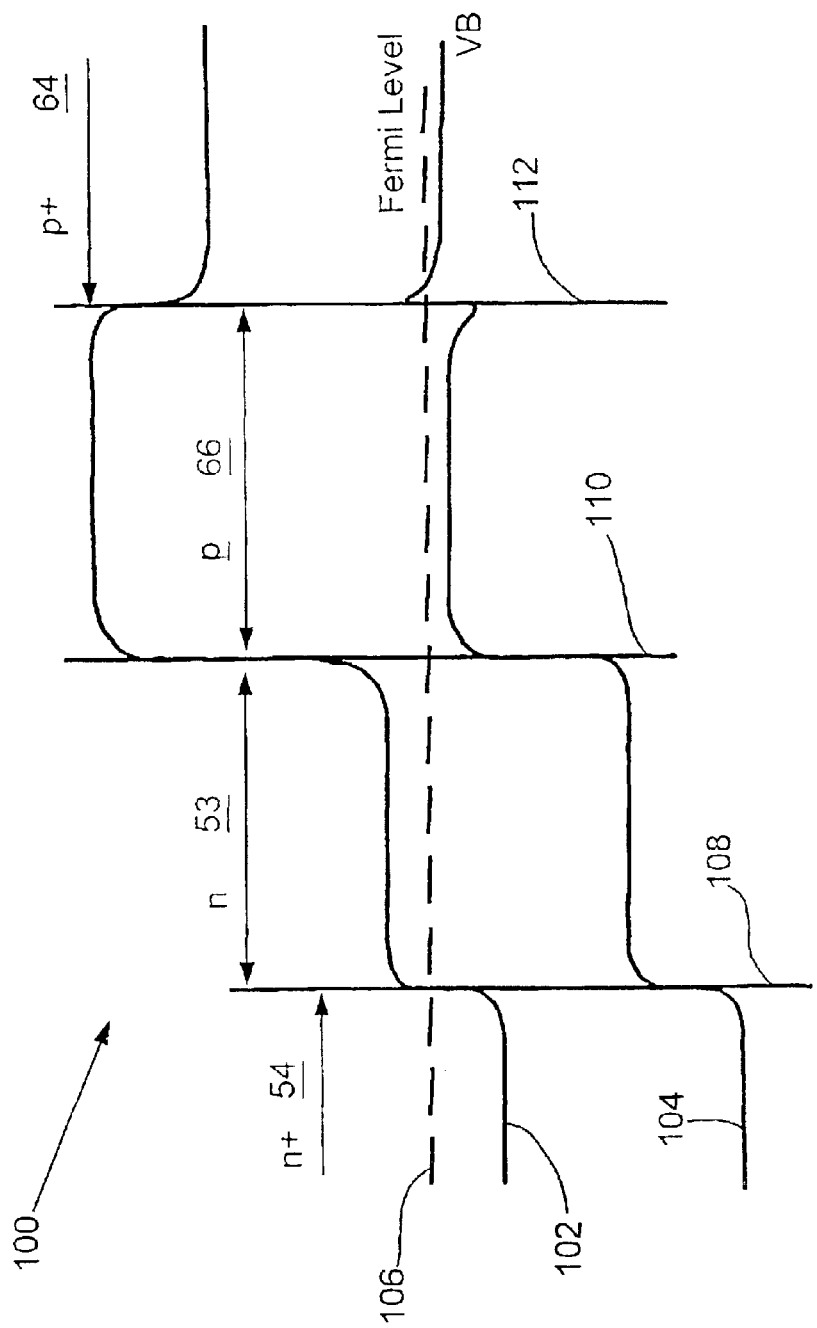
FIG. 7 is an energy band diagram for the sensor of FIG. 5.

FIG. 7 provides the band structure of the sensor 50 in the absence of any applied bias, and comprises a conduction band 102, a valence band 104 and a Fermi Level 106. The n$^+$-type layers 54 form four n$^+$n homojunctions with the n-type limbs 53 at first interfaces 108; the n-type limbs and centre 53 form a np̲ heterojunction with the p̲$^+$-type layer 66 at a second interface 110; the p̲$^+$-type layer 66 forms a p̲$^+$-p$^+$ heterojunction with the p$^+$-type layer 64 at a third interface 112.

The p̲$^+$-type layer 66 forms a barrier in the conduction band 102 inhibiting electron flow from the p$^+$-type layer 64 to the n-type and n+-type layers 53 and 54.

The sensor 50 operates as follows. The semiconductor layers 64, 66, 53 and 54 form four n$^+$np̲p$^+$ diode structures, of which two are shown in section in FIG. 6. The layers 64, 66 and 53 and np̲ junction 110 are common to all four diodes, but each has a separate layer 54 as shown in FIG. 5. The np̲ junction 110 is reversed biased by applying a voltage between the substrate electrode 84 and one of the surface electrodes 80 or 82 This has the important effect of extracting minority carriers from the n-type region 53.

The principle of carrier extraction is known in the prior art and is described in for example European Pat No EP 0167305 and U.S. Pat. No. 5,016,073. It consists of removing minority carriers from a semiconductor region at a greater rate than they are replaced; this occurs at a biased pn junction to which minority carriers diffuse and at which they are extracted and become lost to the region. Carrier transport across the np̲ junction interface 110 comprises:

(a) a conduction current of majority carriers possessing sufficient thermal energy to surmount the junction potential barrier; and (b) a diffusion current of minority carriers which diffuse to the junction and are swept over it by its potential drop.

Thus, carrier transport across the np̲ junction interfaces 110, 112 comprises:

(a) a hole conduction current from the p$^+$-type region 64 to the n-type region 53;

(b) an electron diffusion current from the p$^+$-type region 64 to the n-type region 53—this is very small because there are few minority electrons in p$^+$ and p̲

(c) an electron conduction current from the n-type region 53 to the p$^+$-type region 64 which is also very small; and (d) a hole diffusion current from the n-type region 53 to the p$^+$-type region 64.

In the following qualitative description of operation negligibly small electron currents are ignored.

In the absence of bias, conduction and diffusion hole and electron currents across each interface 108, 110, 112 are balanced, namely the sensor 50 is in equilibrium. A bias voltage is applied across each of the diode structures so that the np̲ junction at the interface 110 is reverse biased; in consequence, minority carriers (holes) in the n-type cruciform layer 53 which diffuse to the interface 110 are swept across it by its potential drop. At the same time, this potential drop inhibits flow of holes from layer 66 to the cruciform layer 53. The reverse bias therefore substantially decreases both the electron conduction current from the cruciform layer 53 to the p$^+$-type region 64, and the hole conduction current from the p$^+$-type region 64 to the cruciform layer 53. Holes are therefore removed from the n-type region 53 by diffusion, and cannot be fully replaced by conduction from the p$^+$-region 64 because of the potential barrier of the reverse biased np̲ junction at the interface 110. As indicated earlier this is the minority carrier extraction effect.

The cruciform n-type layer 53 receives a negligibly small hole (minority carrier) current from the n$^+$ layers 54 because their hole concentrations are very small: this is the minority carrier exclusion effect. In consequence, holes in the layer 53 diffusing to the interface 110 and extracted to the p̲$^+$-type layer 66 cannot be adequately replenished from the n$^+$ layers 54, and therefore the minority carrier concentration in the cruciform layer 53 is reduced. As described earlier, from charge neutrality considerations, the majority carrier concentration must fall to the same extent as the minority concentration, ie electron and hole concentrations fall equally corresponding to reduction in electron-hole pairs: this therefore reduces the intrinsic contribution to conduction in the cruciform layer 53.

In operation of the sensor 50, the np̲ junction 110 is reverse biased, and the sensor 10 functions with bias current flowing between an opposite pair of contacts 16a/16c, the positive contact being excluding. Both sensors 10 and 50 operate with their n-type layers 12 and 53 having below-equilibrium concentrations of electron-hole pairs; these layers are the active regions for magnetic field measurements, and Hall voltages are detectable across pairs of contact layers 16b/16d and 54b/54d. In the sensor 10, carrier concentration is above equilibrium near a negatively biased contact because of carrier accumulation.

Figure 8:
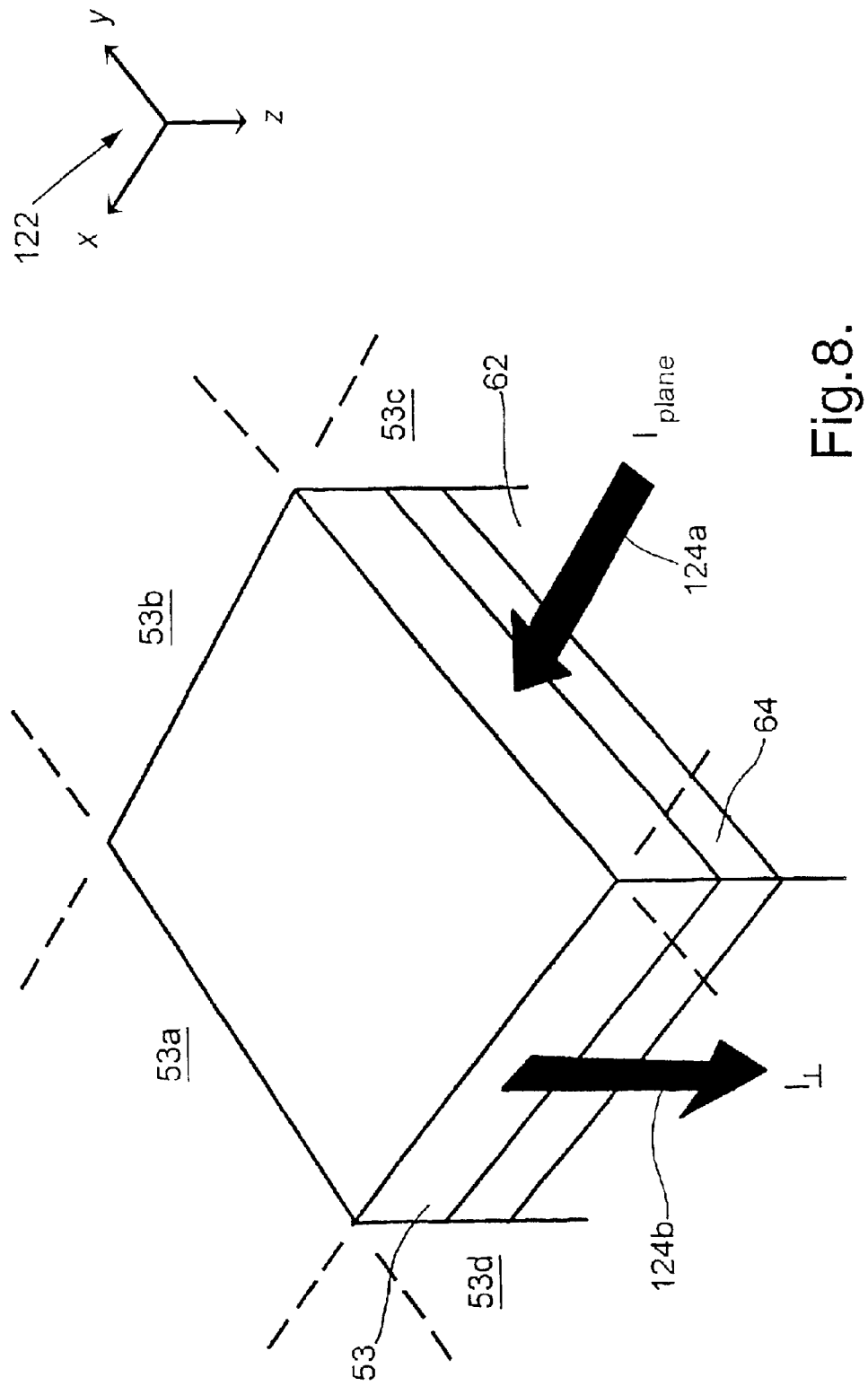
FIG. 8 illustrates a central region of the sensor of FIG. 5.

FIG. 8 is a three-dimensional view of the central square section 53e of the sensor 50 together with supporting p$^+$-type layer 64 and substrate 62. Limbs 53 are indicated by dotted lines. Cartesian axes are shown at 122 for use in defining magnetic field and current flow directions. The surface of the central square section 53e is in the XY plane, has pairs of sides parallel to the X and Y axes respectively, and is perpendicular to the Z axis. Current through the sensor 50 has first and second components $I_{plane}$ and $I_\perp$ indicated by arrows 124a and 124b. The first current component $I_{plane}$ flows parallel to the X axis substantially within the n-type layer 53 and between opposite limbs 53a and 53c.

The second current component $I_\perp$ flows parallel to the Z axis and results from biasing the np̲ junction interface 110. It does not therefore, strictly speaking, flow within the section 53e, but consists of four contributions flowing to respective end layers 54 on the limbs 53 and is included in FIG. 8 for ease of reference. It arises from thermal charge carrier generation in the n-type layer 53, and therefore the associated flow of holes is essentially uniform in a direction parallel to the Z axis down to the p⁺-type layer 66, whilst electron flow occurs laterally and upwardly to the n⁺ layers 54 for electrons originating in the n-type cruciform layer 53 and not directly under the n⁺ regions 54.

A voltage is applied between regions 54a and 54c to establish the current flow $I_{plane}$ which corresponds to a current density $j_x$ flowing parallel to the X axis. Referring once more to FIG. 6, it can be seen that the sensor 50 experiences both extraction and conduction electric fields. The extraction field is applied between the substrate electrode 84 and each of the four limb end layers 54a to 54d respectively. The conduction field is applied between the first pair of opposed limb end layers 54a and 54c. The extraction field gives rise to the current component $I_\perp$, which is a diode leakage parallel to the Z axis. The conduction field produces the current component $I_{plane}$ having current density $j_x$, which is predominantly electron flow in the n-type layer 53 because of the np interface 110 acting as a block to field penetration of the p-type layer 64. The sensor 50 is in a magnetic field $B_z$ parallel to the Z axis and therefore orthogonal to the plane of FIG. 5. The current $I_{plane}$ and magnetic field $B_z$ develop a Hall voltage in the central region 53e parallel to the Y axis, the voltage being measurable between the second pair of limb end layers 54b, 54d.

The current $I_{plane}$ is substantially confined to the n-type layer 53 and the Hall voltage is accordingly developed within this layer. However, by virtue of the carrier extracting and excluding properties of the n⁺npp⁺ structures in the sensor 50, the intrinsic contribution to the carrier concentration is reduced as described above. Conduction and Hall effect are predominantly due to extrinsic conduction in a saturated extrinsic regime with a carrier concentration largely independent of temperature. Moreover, extraction reduces the carrier concentration which reduces electron-hole scattering and its effect on carrier mobility, which in turn becomes less sensitive to temperature change.

Referring to FIG. 9, an alternative form of sensor 128 is shown. It is as in the sensor 50 (like parts being like-referenced) except that it has Hall voltage sensing limbs 53b and 53d which taper to a width d adjacent the central section 53e. Where untapered, all limbs 53 are of width c, and d is less than c; d is preferably less than one tenth of c.

In operation of the sensor 50, minority carriers are extracted from the central section 53e region. The bias field giving rise to the current $I_\perp$ must therefore extract charge carriers not only from the ends of the limbs 53a to 53d but also from the n-type layer 53 throughout the central region 53e. The length of each limb 53a to 53d together with the central node 53e, namely dimension a, must be sufficiently short to allow extraction to extend throughout the limbs 53a to 53d and the central node 53e. However, the path length over which the Hall effect is experienced must be large enough to allow charge carriers to be deflected and generate a measurable signal.

A constraint with regard to the sensor 10 is a need to avoid charge accumulation within the central region 14e. When limb end layers 16a and 16c are biased, charge accumulates at whichever of these is negatively biased with respect to the other. Accumulation must be sufficiently far from the central region 14e to ensure that it does not lessen the carrier exclusion. This therefore provides a minimum length for each limb 14a to 14d (dimension b in FIG. 5) which is governed by sensor operating conditions and limited by an upstream diffusion length $L_d$ given by:

$$L_d \approx \left\{ \frac{1}{2}\left[ \frac{-qE}{kT} - \sqrt{\frac{qE}{kT} + \frac{4}{l^2}} \right] \right\}^{-1} \quad (6)$$

where
E=applied electric field;
q=carrier charge;
k=Boltzmann's constant;
T=absolute sensor temperature; and
l=zero field carrier diffusion length.

The zero field carrier diffusion length l is given by:

$$l = \sqrt{D\tau} \quad (7)$$

where
D=charge carrier diffusion coefficient; and
τ=charge carrier mean lifetime.

In the sensor 50, the Hall current $I_{plane}$ is affected by the diode leakage current $I_\perp$. To reduce this, $I_{plane}$ is preferably much greater than $I_\perp$. However, $I_\perp$ is dependent on bias voltage $V_{bias}$ across the n⁺npp⁺ structure of the sensor 50, and $V_{bias}$ must be large enough to ensure effective extraction. Alternatively, $I_{plane}$ may be made as large as possible within limits set by the power density the sensor 50 can tolerate. This implies a small cross-sectional area through which $I_{plane}$ flows, and is achievable by reducing the n-layer height $t_z$ and width c. The minimum height of the n-type layer 53 is determined by the width of depletion region it must support. This varies with doping level and bias voltage magnitude. Thus, for a given doping level and bias strength, the only remaining variable parameter is the width c of the side of the cruciform structure 53. Suitable values of c will be discussed later.

Similar remarks apply to the sensor 10, for which the bias voltage needs to large enough to ensure adequate carrier exclusion.

The sensors 10 and 50 show performance improvements compared to prior art equilibrium devices, as shown graphically in FIGS. 10, 11 and 12. These drawings are based on calculations involving an n-type InSb layer 53 with donor impurity concentration of $10^{16}$ cm⁻³. They include the effects of both electron and hole contributions to the Hall effect and are therefore more complicated than approximations given earlier. The carrier concentration and therefore also the Hall coefficient in the sensors 10 and 50 is not totally temperature independent, but their variation is sufficiently low (~30–40% change over 50K) for a number of applications. Examples described later improve on this.

In a sensor where carriers from more than one band, ie both electrons and holes, contribute to conductivity, expressions for the Hall voltage $V_H$ are more complicated and are magnetic field dependent. See eg the standard textbook "The Hall Effect and Semiconductor Physics", E H Putley, published by Butterworth and Co., 1960, Chapter 4. The magnetic field dependence is more marked in materials with higher mobilities than silicon.

From Equations (2) and (3), substituting for current density $$j_x = \frac{I_x}{t_y t_z} : -$$

where t$_z$=sensor thickness dimension parallel to magnetic field,
I$_x$=longitudinal sensor current flow orthogonal to Hall and magnetic fields, and other parameters are defined earlier.

$$V_H = \frac{R_H B I_x}{t_z} \qquad (8)$$

FIG. 10 provides four curves 132 to 138 of electron mobility $\mu_e$ plotted against temperature for n-type InSb for different scattering mechanisms and conditions of operation. It illustrates the temperature sensitivity of Hall coefficient R$_H$ for narrow-gap semiconductors when both electrons and holes contribute to conduction. The first curve 132 corresponds to mobility being affected only by scattering from ionised impurities and from electron-hole interactions. The second curve 134 indicates the temperature variation of that component of mobility which is affected solely by optical phonon scattering. The third curve 136 indicates carrier mobility arising from the sum of the contributions giving rise to the first and second curves 132, 134. These three curves 132, 134 and 136, were produced on the basis of an equilibrium carrier concentration. The fourth curve 138 is the variation of mobility $\mu_e$ with temperature T when the intrinsic contribution to conduction has been extracted.

Comparison of curves 136 and 138 illustrates the beneficial effect of carrier extraction for sensors according to the invention, because extraction increases mobility at temperatures above about 250K: differences between the equilibrium curve 136 and the extracted curve 138 become more pronounced at higher temperatures leading to larger Hall coefficient and magneto-resistance. Comparison of the gradients of these two curves shows that the variation of mobility with temperature T is also slightly reduced by extraction. This lessens the temperature dependence of Hall coefficient and magneto-resistance.

FIG. 11 provides two curves 142 and 144 of Hall coefficient R$_H$ plotted against temperature for an InSb semiconductor in an 0.3T magnetic field under equilibrium and extraction conditions respectively. In the equilibrium curve 142, R$_H$ falls by something approaching two orders of magnitude in the interval between 150K and 500K. The second curve 144 is the variation in R$_H$ with temperature for a sensor 50 undergoing minority carrier extraction in accordance to the invention; here R$_H$ is substantially independent of temperature in the same interval indicating the superiority of sensors of the invention with respect to temperature insensitivity.

FIG. 12 shows four curves 152, 154, 156 and 158 of R$_H$ plotted against applied magnetic field for both equilibrium and extracted InSb under various temperature conditions. It illustrates the magnetic field sensitivity of R$_H$ for narrow-gap semiconductors in an intrinsic regime when both electrons and holes contribute to conduction. Curve 152 is for an extracted sensor of the invention, and shows R$_H$ is at least substantially independent of magnetic field. Curve 154 is for a sensor under equilibrium conditions at 200K, and shows R$_H$ is only a little dependent on field—falling by ~3% between 0.1T and 1.5T. Curves 156 and 158 are for a sensor under equilibrium conditions at 300K and 400K respectively; these show R$_H$ reversing in sign and between 0.1T and 1.5T dropping from +200 cm$^3$/C to −10 cm$^3$/C in one case and +30 cm$^3$/C to −50 cm$^3$/C in the other. This indicates the superiority of sensors of the invention with regard to magnetic field effects.

Parameters of sensors of the invention which affect operation are as follows:

(a) Sensor operating temperature range: sensor current density increases with operating temperature (eg 370K), which may give rise to charge carriers with sufficient energy to surmount the barrier at the interface 110;

(b) Composition of In$_{1-x}$Al$_x$Sb barrier layer 66: Table 1 below gives leakage current density as a function of sensor operating temperature for a range of barrier materials (x values) and donor concentrations N$_d$;

(c) Electrical currents: diode leakage current I$_\perp$ is preferably 1% of the Hall current I$_{plane}$, although acceptable sensor measurement accuracy may be obtained with I$_\perp$~10% I$_{plane}$.

(d) Doping concentration of the n-type layer 53: this limits maximum current.

(e) Power density: this has to be limited to a sustainable level within the layer 53 to avoid thermal runaway, eg ~100 W cm$^{-2}$. For the sensor 50, the power density P$_d$ is given by:

$$P_d = \frac{I_{plane}^2}{(en\mu l^2 t_z)} \qquad (9)$$

where

I$_{plane}$=current flowing in the plane of the layer 53;

e=carrier charge;

n=carrier concentration;

$\mu$=carrier mobility in the layer 53;

l=sensor current path length; and t$_z$=thickness of the layer 53.

(f) Applied voltages: in addition to the Hall voltage V$_H$, two other voltages are associated with the sensor 50: a voltage V$_{bias}$ (eg 0.5V) between the substrate electrode 84 and a limb electrode 80 or 82 reverse biases the np junction 110; a voltage V$_{drive}$ between opposite limbs 53a and 53c drives the current I$_{plane}$. The voltage V$_{bias}$ extracts thermally generated charge carriers from the n-type region and it affects the thickness of the depletion layer of the extracting pn junction.

(g) The thickness t$_z$ of the n-type layer 53 should be sufficient to support the pn depletion layer: for doping of 10$^{16}$ cm$^{-3}$ and V$_{bias}$ of 1V it is preferably 0.5 $\mu$m.

(h) The thickness of the p$^+$-type layer 66 is preferably 20 nm. This layer provides a barrier ~10 nm or more thick sufficient to prevent electron tunnelling. The barrier is also sufficiently thin (<30 nm) to preserve strain between it and adjoining InSb layers.

A theoretical model for the sensor 50 has been used to identify suitable device parameters which appear in Tables 1, 2 and 3.

Table 1 lists leakage current densities j$_\perp$ as a function of absolute temperature T for a variety of different doping levels N$_d$ and composition parameters x for In$_{1-x}$Al$_x$Sb.

TABLE 1

| | $j_\perp$ (A cm$^{-2}$) | | | | |
|---|---|---|---|---|---|
| T(K) | x = 0.15<br>$N_d = 10^{17}$ cm$^{-3}$ | x = 0.15<br>$N_d = 10^{16}$ cm$^{-3}$ | x = 0.15<br>$N_d = 10^{15}$ cm$^{-3}$ | x = 0.20<br>$N_d = 10^{15}$ cm$^{-3}$ | x = 0.25<br>$N_d = 10^{15}$ cm$^{-3}$ |
| 230 | 0.24 | 0.073 | 0.23 | 0.23 | 0.23 |
| 250 | 0.85 | 0.25 | 0.61 | 0.61 | 0.61 |
| 270 | 2.54 | 0.75 | 1.38 | 1.36 | 1.36 |
| 290 | 6.77 | 1.98 | 2.79 | 2.66 | 2.65 |
| 310 | 16.5 | 4.84 | 5.4 | 4.73 | 4.7 |
| 330 | 37.9 | 11.5 | 10.8 | 7.9 | 7.73 |
| 350 | 82.9 | 27.5 | 23.3 | 12.7 | 12 |
| 370 | 176 | 66.2 | 54.5 | 20.8 | 18 |
| 390 | 365 | 158 | 132 | 35.8 | 26.5 |
| 410 | 739 | 365 | 314 | 67.5 | 39.3 |
| 430 | 1456 | 803 | 711 | 138 | 60.6 |
| 450 | 2772 | 1666 | 1507 | 291 | 99.8 |

For values for x and $N_d$ in Table 1, Table 2 gives other sensor parameters for an operating temperature of 370K and leakage current to in-plane current ratio $I_\perp/I_{plane}$ limited to 0.9% to 1.1%.

TABLE 2

| | | (T = 370 K; $I_\perp/I_{plane}$ ~1%) | | | | | |
|---|---|---|---|---|---|---|---|
| $N_d$ (cm$^{-3}$) | x | $I_{plane}$ (mA) | $t_z$ (μm) | l (μm) | $V_{bias}$ (volts) | $P_d$ (W/cm$^2$) | $I_\perp/I_{plane}$ |
| $10^{17}$ | 0.15 | 1.0 | 0.2 | 6.3 | 0.03 | 78 | 0.009 |
| $10^{16}$ | 0.15 | 0.5 | 0.5 | 5.0 | 0.06 | 124 | 0.011 |
| $10^{15}$ | 0.2 | 0.2 | 1.5 | 3.2 | 0.08 | 166 | 0.010 |

Values in Table 3 are equivalent to those of Table 2 except that the ratio $I_\perp/I_{plane}$ is increased to a range of 10% to 12%. The sensors 10 and 50 may have $I_\perp/I_{plane}$ in the range 1% to 10%.

TABLE 3

| | | (T = 370 K; $I_\perp/I_{plane}$ ~11%) | | | | | |
|---|---|---|---|---|---|---|---|
| $N_d$ (cm$^{-3}$) | x | $I_{plane}$ (mA) | $t_z$ (μm) | l (μm) | $V_{bias}$ (volts) | $P_d$ (Wcm$^{-2}$) | $I_\perp/I_{plane}$ |
| $10^{17}$ | 0.15 | 2.0 | 0.2 | 100 | 0.62 | 124 | 0.12 |
| $10^{16}$ | 0.15 | 2.0 | 0.5 | 32 | 0.25 | 50 | 0.11 |
| $10^{15}$ | 0.2 | 1.0 | 1.5 | 22 | 0.42 | 83 | 0.10 |

Table 1 indicates the difficulty of maintaining a leakage current density $j_\perp$ at a reasonable level at higher operating temperatures T. Increasing the composition parameter x of the barrier layer 66 reduces the leakage current density $j_\perp$ and the drive current necessary to maintain a constant ratio $I_\perp/I_{plane}$; it also reduces sensor power dissipation. For example, a change in composition in x from 0.15 to 0.25 allows larger current densities to be supported and means that leakage current density of 55 Amp/cm$^2$ for $N_d=10^{15}$ cm$^{-3}$ corresponds to an operating temperature of approximately 200K, as opposed to 370K.

Table 2 shows that, when an impurity concentration of $10^{15}$ cm$^{-3}$ is employed, it becomes difficult to find conditions under which the power density $P_d$ remains reasonable for reliable sensor operation, even with a larger barrier composition. On the other hand, increasing impurity concentration from ~$10^{15}$ cm$^{-3}$ to ~$10^{17}$ cm$^{-3}$ reduces carrier mobility by a factor of ~3. Moreover, the proximity of highly n-type regions to p-type regions can result in carrier tunnelling contributing to $j_\perp$. Table 2 therefore indicates that an optimum doping concentration is ~$10^{16}$ cm$^{-3}$; a sensor current path length of 5 μm gives an acceptable power density $P_d$ of 124 watt/cm$^2$.

Table 3 indicates that increasing $I_\perp/I_{plane}$ allows larger sensors to be used: the latter are easier to make and support larger currents for equivalent power density giving larger Hall voltages and better sensitivity.

Referring now to FIG. 13, there is shown a circuit 200 for the sensor 10. A battery 210 with positive and negative terminals 212 and 214 is connected directly to limb end layer 16c and through a series resistor $R_L$ to limb end layer 16a respectively.

The battery 210 biases end layer 16c positive with respect to end layer 16a, and provides a current $I_{plane}$ through end layer 16c, limb 14c, central region 14e, limb 14a and end layer 16c. Because of its positive bias, end layer 16c is an excluding contact to the n-type active region 14, which in consequence becomes depleted of equal numbers of electrons and holes as described earlier largely eradicating the intrinsic contribution to conduction. The exclusion zone extends through the limb 14c, central region 14e and limb 14a. With a magnetic field applied normal to the plane of the drawing, a Hall voltage is developed between the regions 16b, 16d. The current flowing between end layer 16c and 16a is predominantly due to one carrier type only, ie electrons activated from donor impurities, and the sensor operates in a regime which simulates the extrinsic saturated regime of a wider band gap material such as Si.

Referring now to FIG. 14, there is shown a circuit 300 for the sensor 50. The circuit 300 has a first battery 310 with positive and negative terminals 312 and 314 connected directly to limb end layer 16c and through a series resistor $R_S$ to limb end layer 16a respectively. A second battery 320 has a negative terminal 322 connected through a series resistor $R_B$ to a sensor substrate connection 330, and also a positive terminal 334 connected to region 16c and to the first battery's negative terminal 314.

The first battery 310 biases the sensor 50 through resistor $R_S$, and current $I_{plane}$ flows between end layers 54a and 54c via limb 53a, central region 53e and limb 53c. The second battery 330 biases the substrate 62 (see FIG. 6) relative to end layers 54a and 54c, which reverse biases the np heterojunction 110 between layers 53 and 66. Layer 66 acts as an extracting contact to layer 53, in which the intrinsic contribution to conduction is largely eradicated in consequence. The current $I_{plane}$ in the layer 53 is therefore predominantly due to one carrier type only, ie electrons activated from donor impurities, and the sensor 50 operates in a regime which simulates the extrinsic saturated regime. With a magnetic field normal to the plane of the drawing, the sensor 50 develops a Hall voltage $V_H$ across the central region 53e detectable across the end layers 54b and 54d.

Hall effect and magneto-resistance sensors are normally operated in a current driven mode in which sensor current is held constant and change in voltage is detected to indicate magnetic field B, which for a Hall effect sensor is given by:

$$B = \frac{V_H e n t_z}{I_x} \quad (10)$$

where parameters are as defined earlier.

From Equation (1):

$$R_M = R_0(1 + \mu^2 B^2) = \frac{V_D}{I_x} \quad (11)$$

where $V_D$ is longitudinal voltage driving a current $I_x$ through a magneto-resistance sensor; rearranging:

$$B = \frac{1}{\mu}\sqrt{\frac{V_D}{I_x R_0} - 1} \quad (12)$$

In current driven mode the measured value of B depends on the carrier concentration n, which is subject to generation—recombination noise in the semiconductor and affects the measurement also. Sensors with charge carrier extraction are influenced by 1/f noise due either to carrier concentration fluctuation or to mobility fluctuation. Existing (inconclusive) evidence favours concentration fluctuation: if so the current driven/voltage read mode would be subject to 1/f noise.

An alternative mode of operation for a magnetic field sensor of the invention is voltage drive—ie operation at constant drive voltage—and voltage read to indicate magnetic field B: for a magneto-resistance sensor B remains given by Equation (12), and for a Hall effect sensor it is given by:

$$B = \frac{l_x V_H}{t_y \mu V_D} \quad (13)$$

here $l_x$ is sensor length and other terms are as defined earlier. In voltage drive mode the measured value of B is independent of carrier density and is temperature dependent only because of mobility temperature dependence: the latter is a slow variation and also counteracts effects due to any residual carrier concentration change because the two produce opposite effects. Moreover, this measured value of B would not be subject to generation—recombination noise or 1/f noise, if the latter is due to density fluctuations.

Voltage drive mode is not generally used because it can cause sensor thermal runaway and instability. However, a sensor of the invention is stabilised against thermal runaway because the latter is due to intrinsic conduction which the invention reduces. Furthermore, operation in this mode does not require reduction of the intrinsic contribution to as great a degree as other modes to obtain equivalent performance. It is also expected to result in operability of a sensor over a larger temperature range than current driven mode.

A further alternative is to operate a Hall effect sensor of the invention in a current drive and current read mode: in this mode sensor current $I_x$ is held constant and Hall voltage is employed to drive a current in a external circuit connected across Hall voltage electrodes, and the latter current is measured. This mode should in principle have the same advantages as the voltage drive and voltage read mode. Current flow pattern in a current drive and current read mode through such a sensor is complex and requires numerical modelling for full assessment. Current read out is used when there is a need to drive a device directly using the sensor output signal.

Referring now to FIG. 15, a magneto-resistive sensor of the invention 400 is shown in section, but as indicated by zigzag lines such as 402 is not drawn to scale. Parts equivalent to those shown in FIG. 6 are like-referenced with a prefix 400. The sensor 400 includes a 1 μm thick substrate layer 464 of p$^+$-type InSb upon a substrate 462 of InSb or GaAs and having an electrical bias contact 484, which may be relocated more remotely if desired. The layer 464 is surmounted by a 20 nm thick layer 466 of p$^+$-type In$_{1-x}$Al$_x$Sb with x in the range 0.1 to 0.5, preferably 0.1 to 0.2, eg 0.15. The layer 466 is covered by a 0.5 μm thick layer 404 consisting largely of p-type InSb with a dopant concentration of $3\times10^{15}$ cm$^{-3}$, but incorporating 30 nm below its surface 406 an ultra-thin layer of silicon 408 indicated by a chain line: the silicon layer 408 is referred to as a δ-doping layer. In operation the δ-doping layer 408 provides a two dimensional electron gas with concentration in the range $6\times10^{11}$ cm$^{-2}$ to $2\times10^{12}$ cm$^{-2}$, e.g. $1\times10^{12}$ cm$^{-2}$.

Two n+ regions 411 of InSb 30 nm thick are deposited on the layer 404 providing electrical connections to it: they allow voltage across the sensor 400 to be measured and hence sensor resistance determined to provide a measure of magnetic field. They are separated by a distance in the range 2 to 5 μm, eg 3.5 μm. In plan, the sensor 400 is as shown in FIG. 1 except there are no limbs 14a and 14c.

The sensor 400 is a n$^+$-p-p$^+$-p$^+$ diode structure in which the p layer 404 undergoes carrier extraction when a reverse bias is applied, ie when one of the electrodes 411 is biased positive with respect to the substrate 462. This is because the interface between layers 411 and 404 is an n$^+$p junction which is an extracting contact when reverse biased. The carrier concentration is reduced to well below the intrinsic concentration prevailing during absence of bias, and it becomes largely independent of temperature as in the saturated extrinsic regime.

A conducting layer of electrons is provided to the p layer 404 by the δ-doping layer 408: the electrons form a two-dimensional gas with a concentration which also remains largely constant with temperature, because it is set by a doping concentration, not by thermal activation. Electrons from the δ-doping layer 408A are the dominant source of charge carriers in the p layer 404, which is the sensor active region. The n$^+$ layers 411 act as source and drain connections to the p layer 404, which provides the conducting path between them. It is the resistance of this conducting path that is magnetic field dependent according to Equation (1), and provides the magneto-resistance effect by which magnetic field is measured.

The minority carrier (electron) mobility and hence also the electron diffusion length are much higher in a p-type semiconductor material than the hole mobility in an n-type equivalent: the carrier extraction effect extends over a minority carrier diffusion length, and in consequence of the two conductivity types p-type material undergoes much more efficient extraction, and the carrier concentration has a greater degree of temperature independence. In the sensor 400 the carrier concentration and resistance $R_0$ change over 50K is about 2%, which is sufficiently constant for many applications.

Referring now to FIG. 16, a magneto-resistive sensor 500 is shown in section, but as indicated by zigzag lines such as 502 is not drawn to scale. The sensor 500 comprises a 1 μm thick layer 504 of p$^+$-type In$_{0.85}$Al$_{0.15}$Sb with a dopant concentration of 2×10$^{18}$ cm$^{-3}$. The layer 504 is upon a substrate 506 of InSb or GaAs and has an electrical bias contact 508, which may be more remotely located. The layer 504 bears an 0.5 μm thick layer 510 of p$^-$-type In$_{0.85}$Al$_{0.15}$Sb which is nominally undoped—less than 1×10$^{16}$ cm$^{-3}$. The layer 510 is covered by a 15 nm thick quantum well 512 of p-type InSb with a dopant concentration of 3×10$^{15}$ cm$^{-3}$. The quantum well 512 is covered by a 150 nm thick layer 514 (acceptable thickness range 100–200 nm) consisting largely of p$^-$-type In$_{0.85}$Al$_{0.15}$Sb which is nominally undoped—less than 1×10$^{16}$ cm$^{-3}$. The p$^-$-type layer 514 incorporates a silicon n-type δ-doping layer 518 above the quantum well 512 and spaced apart from it by a distance in the range 10–40 nm. In operation the δ-doping layer 518 provides a two-dimensional electron gas with concentration in the range 6×10$^{11}$ cm$^{-2}$ to 2×10$^{12}$ cm$^{-2}$, eg 1×10$^{12}$ cm$^{-2}$ which forms in the quantum well 512 because it is energetically favourable: this is referred to as modulation doping and the electron gas concentration also remains constant with temperature.

Two n$^+$ regions 520 of InSb 30 nm thick are deposited on and provide electrical connections to the layer 514: they allow voltage across the sensor 500 to be measured and hence sensor resistance determined to provide a measure of magnetic field. They are separated by a distance in the range 2 to 5 μm, eg 3.5 μm. In plan, the sensor 500 is as shown in FIG. 1 except that limbs 14a and 14c are absent.

The sensor 500 is a n$^+$-p$^-$-quantum well-p$^-$-p$^+$ diode structure in which the quantum well 512 undergoes carrier extraction when a reverse bias is applied, ie with one or both of the electrodes 520 biased positive with respect to the substrate 506. This is because the interface between layers 514 and 520 is an n$^+$p junction which is an extracting contact when reverse biased. The carrier concentration in the quantum well 512 is reduced to well below the intrinsic equivalent for absence of bias, and here again it becomes largely independent of temperature as in a saturated extrinsic regime. Electrons from the δ-doping layer 408 are then the dominant source of charge carriers in the quantum well 512 which is the sensor active region. Other regions 504, 510 and 514 of the sensor 500 have much wider band-gap than the quantum well 512 and their carrier concentrations can be considered to be constant.

The n$^+$ layers 520 act as source and drain electrodes between which there is a conducting path via the p$^-$ layer 514 and the quantum well 512. It is the resistance of this conducting path that is magnetic field dependent and enables magnetic field to be measured.

In the sensor 500 the carrier concentration change over 50K is less than 1%: this is a very high degree of constancy and suitable for demanding applications. It performs better in this regard compared to earlier embodiments because the quantum well carrier concentration is determined by modulation doping, which is a fixed parameter unlike thermal activation of electron-hole pairs.

The layer structures shown in FIGS. 6, 15 and 16 may each be used to make both Hall effect and magnetoresistance sensors. The difference between the two types of sensor is simply that the former has a four terminal configuration as in FIG. 1 and the latter a two terminal configuration corresponding to absence (or non-use) of limbs 14b and 14d.

What is claimed is:

1. A magnetic field sensor comprising:
    a semiconducting sensor element comprising:
        an active region having an at least partially intrinsic conduction regime when unbiased and at a normal operating temperature; and
        a layer on said active region providing junction between said layer and said active region, said junction is one of an excluding contact and an extracting contact, said junction biasable to reduce intrinsic conduction in the active region and confine charge carriers predominantly to one type only corresponding to an extrinsic saturated regime, and
    means for detecting a signal developed in the active region in response to an applied magnetic field in the active region during biasing of said junction.

2. A sensor according to claim 1, wherein the junction is an excluding contact for exclusion of minority carriers from the active region.

3. A sensor according to claim 2, wherein the excluding contact is a homojunction between indium antimonide materials of different doping concentration.

4. A sensor according to claim 2, wherein the excluding contact is a heterojunction between indium antimonide and a material having a wider band gap than indium antimonide.

5. A sensor according to claim 1, wherein said sensor is a cruciform Hall effect sensor with a central active region from which four limbs extend, at least one limb is connected to an excluding contact for depleting the active region's minority carrier concentration when biased, a first pair of limbs is connectable to a current supply and a second pair of limbs is connectable to Hall voltage measuring apparatus.

6. A sensor according to claim 5, wherein each of the second pair of limbs has a tapering portion adjacent the central active region.

7. A sensor according to claim 5, wherein each limb is connected to a respective excluding contact.

8. A sensor according to claim 1, wherein the junction is an extracting junction for extraction of minority carriers from the active region.

9. A sensor according to claim 8, wherein the extracting junction is a junction between two sensor regions of materials having different majority carrier type and different band gap.

10. A sensor according to claim 9, wherein the extracting junction is a heterojunction of n-type indium antimonide and In$_{1-x}$Al$_x$Sb where x is in the range 0.10 to 0.5.

11. A sensor according to claim 10, wherein x substantially 0.15.

12. A sensor according to claim 8, wherein the extracting junction is:
    sufficiently thick to prevent electron tunnelling through it; and
    sufficiently thin to avoid relaxing strain in materials associated with it.

13. A sensor according to claim 12, wherein x is in the range 0.15 to 0.2.

14. A sensor according to claim 8, wherein said sensor is cruciform with a central active region from which four limbs extend, the limbs have four successively disposed layers of which two adjacent layers are of one majority carrier type and two other adjacent layers are of the other majority carrier type, the extracting junction is a heterojunction between an active region layer and another layer of different band gap and majority carrier type, a first pair of limbs is connectable to a current supply, a second pair of limbs is connectable to Hall voltage measuring apparatus, and the extracting junction is reverse-biasable by means of a sensor substrate connection.

15. A sensor according to claim 14, wherein the four successively disposed layers are an n⁺npp⁺ structure.

16. A sensor according to claim 14, wherein each limb of the second pair of limbs has a tapering portion adjacent the central region.

17. A sensor according to claim 14, wherein each limb of the second pair of limbs has a contact region adjoining onto the central active region which less than 10% of the limb width of each limb of the first pair of limbs.

18. A sensor according to claim 8, wherein extraction current flow in a direction substantially orthogonal to charge carrier deflection by a magnetic field in normal operation.

19. A sensor according to claim 1, wherein the junction is extracting and the active region is p-type.

20. A sensor according to claim 1, wherein the active region is a quantum well structure.

21. A sensor according to claim 20, wherein said sensor includes a δ-doping layer arranged to be a dominant source of charge carriers for the quantum well structure.

22. A sensor according to claim 20, wherein said sensor includes a n⁺-p̱⁻-quantum well-p̱⁻-p⁺ diode structure.

23. A sensor according to claim 1, wherein said sensor includes a δ-doping layer arranged to be a dominant source of charge carriers for the active region.

24. A sensor according to claim 23, wherein said sensor is comprised of an n⁺-p-p̱⁺-p⁺ diode structure.

25. A method of detecting a magnetic field, said method comprising the steps of:

a) providing a magnetic field sensor incorporating a semiconducting sensor element with an active region being in an at least partially intrinsic conduction regime at a normal operating temperature when unbiased, and a layer on said active region providing a junction between said layer and said active region, said junction forming one of an excluding contact and an extracting contact, said junction biasable to reduce an intrinsic contribution to conduction in the active region and confine charge carriers predominantly to one type only corresponding to an extrinsic saturated regime;

b) biasing the sensor active region and the junction to provide for charge carrier flow in the active region and sensor operation to correspond to an extrinsic saturated regime and applying magnetic field to the active region; and c) detecting a signal developed by the active region at least partially in response to the magnetic field.

26. A method of detecting a magnetic field according to claim 25 wherein the step of biasing the sensor active region is carried out at constant voltage and the step of detecting a signal involves detecting a voltage signal.

27. A method of detecting a magnetic field according to claim 25 wherein the sensor is a Hall effect sensor, the step of biasing the sensor active region involves applying a constant current thereto and the step of detecting a signal involves detecting a current signal.

* * * * *

UNITED STATES PATENT AND TRADEMARK OFFICE
CERTIFICATE OF CORRECTION

PATENT NO. : 6,809,514 B2
DATED : October 26, 2004
INVENTOR(S) : Ashley et al.

It is certified that error appears in the above-identified patent and that said Letters Patent is hereby corrected as shown below:

Column 3,
Line 52, "(14e, 53e)" should be deleted.

Column 4,
Line 33, "(14b, 14d)" should be deleted.

Column 19,
Line 13, "flow" should read -- flows --.

Signed and Sealed this

Twenty-second Day of February, 2005

JON W. DUDAS
*Director of the United States Patent and Trademark Office*

UNITED STATES PATENT AND TRADEMARK OFFICE
CERTIFICATE OF CORRECTION

PATENT NO.         : 6,809,514 B2
APPLICATION NO. : 10/258852
DATED                : October 26, 2004
INVENTOR(S)       : Ashley et al.

It is certified that error appears in the above-identified patent and that said Letters Patent is hereby corrected as shown below:

Title page, item (54), and Column 1, lines 2, 3 title of the invention:

"EXCLUDING" should read --EXCLUSION--; and

"INSTRINSIC" should read --INTRINSIC--.

Signed and Sealed this

Eleventh Day of December, 2007

JON W. DUDAS
*Director of the United States Patent and Trademark Office*

UNITED STATES PATENT AND TRADEMARK OFFICE
CERTIFICATE OF CORRECTION

PATENT NO.         : 6,809,514 B2                                          Page 1 of 1
APPLICATION NO.    : 10/258852
DATED              : October 26, 2004
INVENTOR(S)        : Ashley et al.

It is certified that error appears in the above-identified patent and that said Letters Patent is hereby corrected as shown below:

Title page, item (54) and Column 1, lines 1-5, title of the invention should read:

"MAGNETIC FIELD SENSOR INCLUDING CARRIER EXCLUSION OR EXTRACTION FOR REDUCING AN INTRINSIC CONTRIBUTION TO CARRIER CONCENTRATION IN THE ACTIVE REGION"

Signed and Sealed this

Seventeenth Day of March, 2009

JOHN DOLL
*Acting Director of the United States Patent and Trademark Office*